US010063207B2

(12) United States Patent
Malak et al.

(10) Patent No.: US 10,063,207 B2
(45) Date of Patent: Aug. 28, 2018

(54) OBJECT-BASED AUDIO LOUDNESS MANAGEMENT

(71) Applicant: DTS, Inc., Calabasas, CA (US)

(72) Inventors: Fadi Malak, Menlo Park, CA (US); Themis Katsianos, Highland, CA (US); Jean-Marc Jot, Aptos, CA (US)

(73) Assignee: DTS, Inc., Calabasas, CA (US)

(*) Notice: Subject to any disclaimer, the term of this patent is extended or adjusted under 35 U.S.C. 154(b) by 139 days.

(21) Appl. No.: 14/632,997

(22) Filed: Feb. 26, 2015

(65) Prior Publication Data

US 2015/0245153 A1 Aug. 27, 2015

Related U.S. Application Data

(60) Provisional application No. 61/945,734, filed on Feb. 27, 2014.

(51) Int. Cl.
*H03G 3/20* (2006.01)
*H03G 7/00* (2006.01)
(Continued)

(52) U.S. Cl.
CPC ................ *H03G 7/00* (2013.01); *H04S 7/30* (2013.01); *G10L 19/008* (2013.01); *H03G 3/002* (2013.01);
(Continued)

(58) Field of Classification Search
None
See application file for complete search history.

(56) References Cited

U.S. PATENT DOCUMENTS

2005/0078833 A1 4/2005 Hess et al.
2009/0220109 A1 9/2009 Crockett et al.
(Continued)

FOREIGN PATENT DOCUMENTS

WO 2014025752 A1 2/2014
WO 2014099285 A1 6/2014
(Continued)

OTHER PUBLICATIONS

International Search Report and Written Opinion dated Jun. 8, 2015, regarding PCT Application No. PCT/US2015/018045.
(Continued)

*Primary Examiner* — James Mooney
(74) *Attorney, Agent, or Firm* — Craig Fischer; Jonas Hodges; Arent Fox

(57) ABSTRACT

A method and apparatus for processing object-based audio signals is provided. The apparatus receives a plurality of object-based audio signals. Each object-based audio signal of the object-based audio signals includes audio waveform data and object metadata associated with the audio waveform data. The object metadata includes at least one of a loudness parameter or a power parameter associated with the audio waveform data. The apparatus determines a loudness metric based on the received object-based audio signals and based on the at least one of the loudness parameter or the power parameter for each object-based audio signal of the received object-based audio signals. In one configuration, the apparatus renders the received object-based audio signals to a set of output signals based on the determined loudness metric. In another configuration, the apparatus transmits (e.g., broadcast, file delivery, or streaming) the received object-based audio signals based on the determined loudness metric.

31 Claims, 11 Drawing Sheets

(51) Int. Cl.

| | |
|---|---|
| ***H04S 7/00*** | (2006.01) |
| *H03G 3/00* | (2006.01) |
| *H03G 3/30* | (2006.01) |
| *G10L 19/008* | (2013.01) |

(52) U.S. Cl.

CPC ........ *H03G 3/3026* (2013.01); *H04S 2400/11* (2013.01); *H04S 2400/13* (2013.01)

(56) References Cited

U.S. PATENT DOCUMENTS

| | | | |
|---|---|---|---|
| 2011/0150242 A1 | 6/2011 | Zong et al. | |
| 2014/0211946 A1 | 7/2014 | Seefeldt et al. | |
| 2016/0295343 A1* | 10/2016 | Tsingos | H04S 7/308 |

FOREIGN PATENT DOCUMENTS

| | | | |
|---|---|---|---|
| WO | 2014111308 | A2 | 7/2014 |
| WO | 2014113465 | A1 | 7/2014 |

OTHER PUBLICATIONS

Max Neuendorf, et al., Contribution to MPEG-H 3D Audio Version 1, MPEG Meeting; Oct. 28, 2013-Jan. 11, 2013; Geneva; (Motion Picture Expert Group or ISO/IEC JTC1/SC29/WG11), 34 pages.

Anonymous: “Recommendation ITU-R BS.1770-3 Algorithms to measure audio programme loudness and true-peak audio level BS Series Broadcasting service (sound),” 24 pages.

Anonymous: “R 128 Loudness Normalisation and Permitted Maximum Level of Audio Signals,” Status: EBU Recommendation, Jun. 30, 2014, 5 pages.

Anonymous: “10 things you need to know about . . . EBU R 128,” Sep. 30, 2011, 2 pages.

European Patent Office Extended European Search Report in corresponding European Patent Application No. 15754660.7; 11 pages.

* cited by examiner

OBJECT-BASED AUDIO LOUDNESS MANAGEMENT

CROSS-REFERENCE TO RELATED APPLICATION(S)

This application claims the benefit of U.S. Provisional Application Ser. No. 61/945,734, entitled "OBJECT-BASED AUDIO LOUDNESS MANAGEMENT" and filed on Feb. 27, 2014, which is expressly incorporated by reference herein in its entirety.

BACKGROUND

Field

The present disclosure relates generally to loudness management, and more particularly, to object-based audio loudness management.

Background

Loudness is a recurring issue primarily in stream-type delivery of linear (real-time) entertainment. Linear entertainment may include broadcast linear programming, video on demand (VOD), and over-the-top (OTT) streaming. In the past, several international standards organizations, made up of a worldwide assortment of audio engineers and experts, have defined methods for accurately measuring the perceived loudness of a broadcast audio mix. While initially this work was done by standards organizations, eventually regulatory agencies of national governments became involved. These regulatory agencies issued regulations for implementing a standardized set of technical specifications, setting forth their use, and recommending best practices. However, this work has been done only in the channel-based audio world of stereo and more recently 5.1 channel surround sound.

SUMMARY

In an aspect of the disclosure, a method and an apparatus for processing object-based audio signals for reproduction through a playback system are provided. The apparatus receives a plurality of object-based audio signals. Each object-based audio signal of the object-based audio signals includes audio waveform data and object metadata associated with the audio waveform data. The object metadata includes at least one of a loudness parameter or a power parameter associated with the audio waveform data. The apparatus determines a loudness metric based on the received object-based audio signals and based on the at least one of the loudness parameter or the power parameter for each object-based audio signal of the received object-based audio signals. The apparatus renders the received object-based audio signals to a set of output signals based on the determined loudness metric.

In an aspect of the disclosure, a method and an apparatus for processing object-based audio signals for at least one of broadcast, file delivery, or streaming are provided. The apparatus receives a plurality of object-based audio signals. Each object-based audio signal of the object-based audio signals includes audio waveform data and object metadata associated with the audio waveform data. The object metadata includes at least one of a loudness parameter or a power parameter associated with the audio waveform data. The apparatus determines a loudness metric based on the received object-based audio signals and based on the at least one of the loudness parameter or the power parameter for each object-based audio signal of the received object-based audio signals. The apparatus transmits the received object-based audio signals based on the determined loudness metric.

BRIEF DESCRIPTION OF THE DRAWINGS

Referring now to the drawings in which like reference numbers represent corresponding parts throughout.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

In the following description of embodiments of a spatial normalization OBA loudness management system and method, reference is made to the accompanying drawings. These drawings show by way of illustration specific examples of how embodiments of the spatial normalization OBA loudness management system and method may be practiced. It is understood that other embodiments may be utilized and structural changes may be made without departing from the scope of the claimed subject matter.

I. Introduction

With the advent of OBA, new opportunities and challenges have surfaced. One key issue is how to measure and to manage loudness when an arbitrary number of audio objects can exist in a mix. The ability to measure and to manage loudness is especially important when interactive control is introduced in the home, thereby allowing a consumer to add or to drop audio objects. While the flexibility of OBA has many advantages, OBA does introduce challenges because existing methods of channel based loudness management and control are unacceptable.

Figure 1:
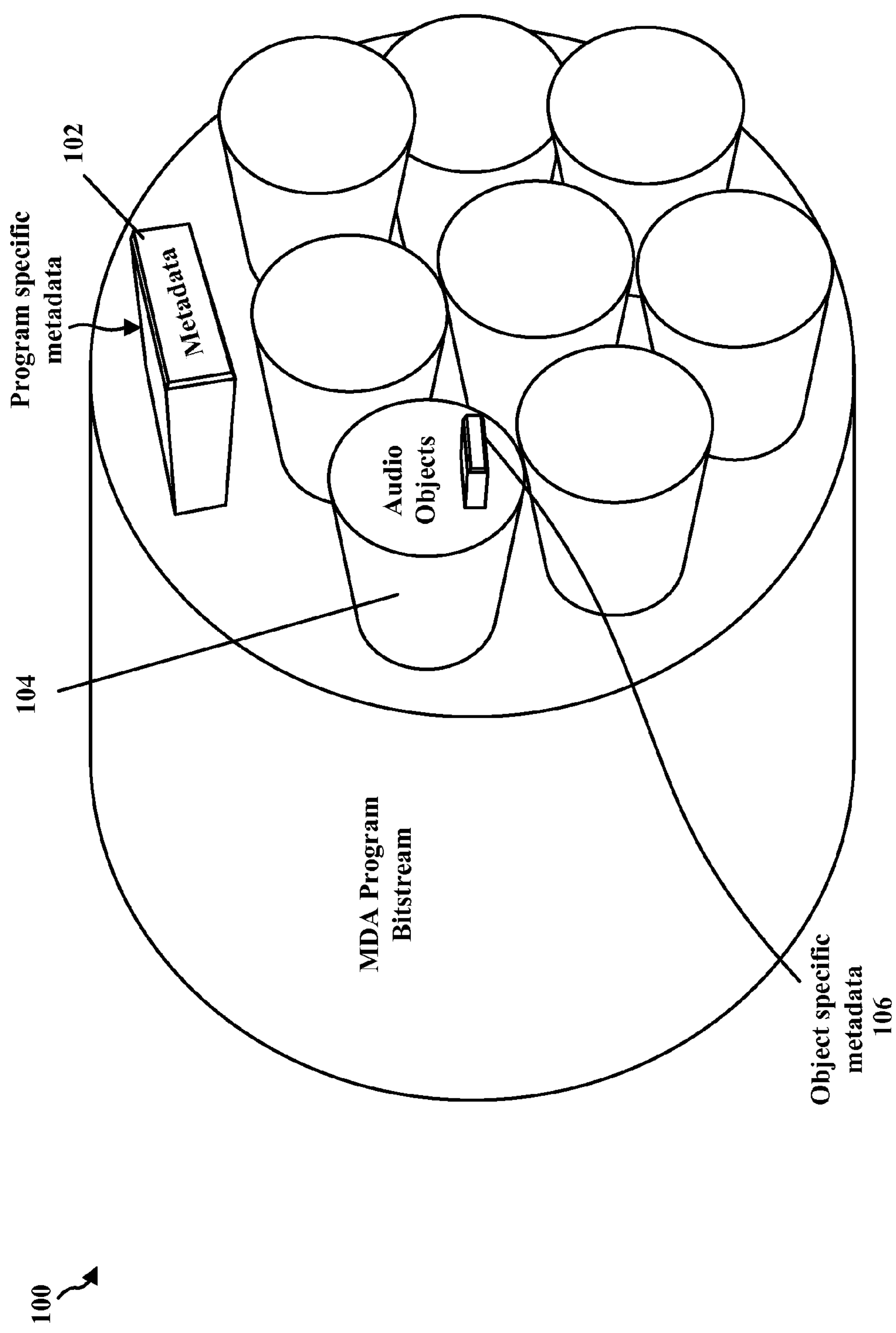
FIG. 1 illustrates an exemplary construction of a multi-dimensional audio bitstream for use by embodiments of the spatial normalization object-based audio (OBA) loudness management system and method.
Figure 2:
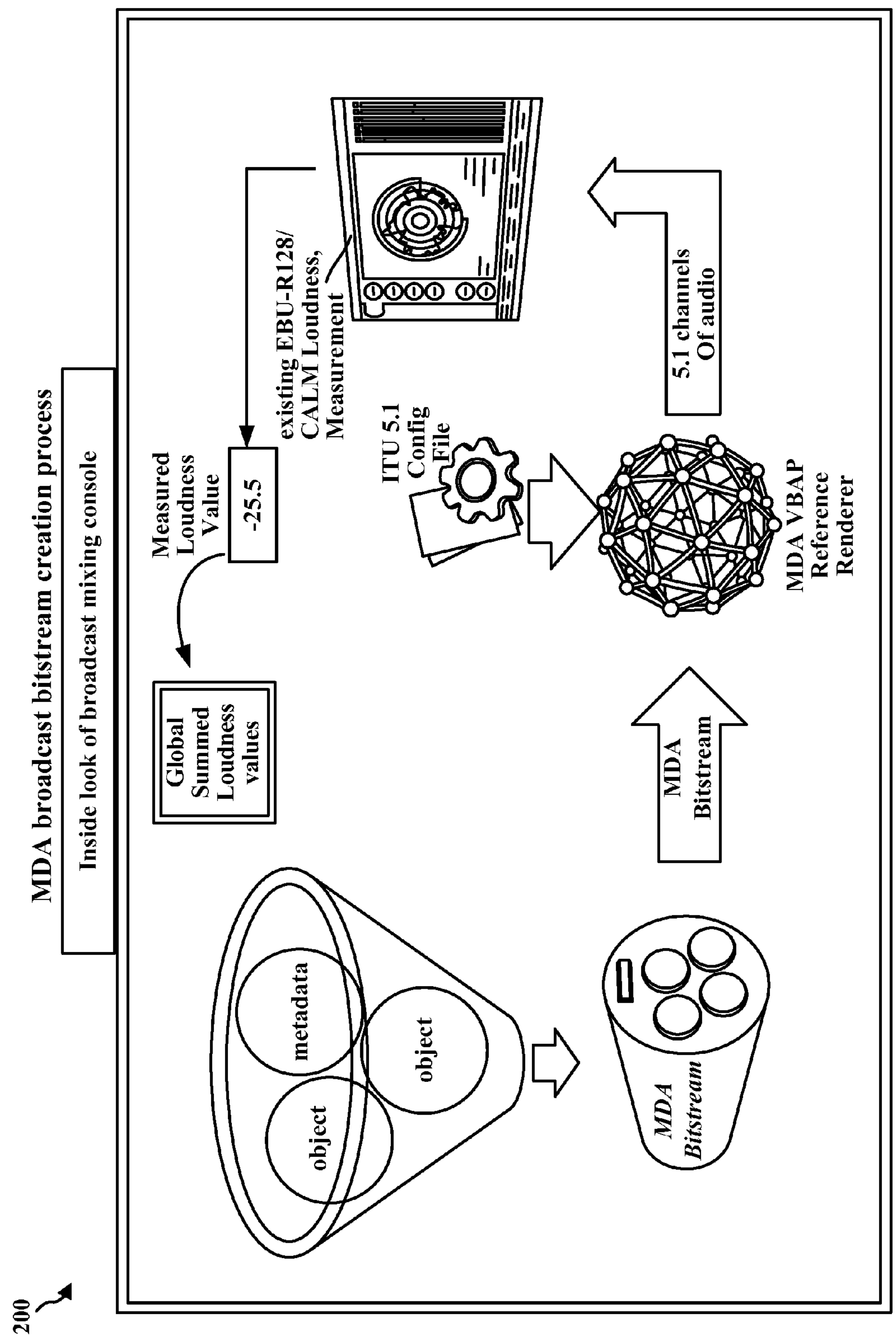
FIG. 2 is a block diagram illustrating an overview of an exemplary implementation of the multi-dimensional audio (MDA) broadcast bitstream creation process.

FIG. 1 illustrates an exemplary construction of an MDA program bitstream 100 for use by embodiments of the spatial normalization OBA loudness management system and method. FIG. 2 is a block diagram 200 illustrating an overview of an exemplary implementation of the MDA broadcast bitstream creation process. An MDA program bitstream 100 may include program specific metadata 102 and a plurality of audio objects 104. An audio object 104 is one or more audio waveforms with dynamic or static object specific metadata 106 that describes certain characteristics of those waveforms. These characteristics may include positional location in three-dimensional (3D) space at a given point in time, measured loudness values, the nature of the object (such as an instrument, effect, music, background, or dialog), dialog language, how to display the object, and metadata in the form of instructions on how to process, to render, or to playback the object. In pure OBA, the audio objects 104 are not mapped to a specific channel. In fact, it may be unknown how many channels the playback configuration contains. In other words, the audio object 104 is intended to be processed in a unitary fashion independent of any particular pre-defined or fixed playback configuration of rendering speakers. In these situations, the rendering process is done later so as to convert and to mix to playback channels (as defined by the playback configuration).

In general, loudness is defined as an attribute of auditory sensation in terms of which sounds can be ordered on a scale extending from quiet to loud. Loudness is a subjective measure that is affected by sound pressure level (SPL), frequency, bandwidth, duration, and proximity. Moreover, the International Telecommunication Union (ITU) Broadcasting Service (BS) 1770 (ITU BS.1770) is a broadcast standard for defining and computing loudness and the European Broadcasting Union (EBU) R-128 defines how broadcasters can measure and normalize audio.

There currently exist both open and proprietary examples of OBA. The spatial normalization OBA loudness management system and method described herein uses OBA having a rich set of metadata that includes a comprehensive set for loudness values. An open OBA bitstream has an open architecture so that the metadata is readable and accessible at any given point in the bitstream's existence. By way of example and not limitation, MDA is such an open format that includes a bitstream representation and an OBA payload. MDA is a completely open object-based audio immersive audio platform that allows any content provider to mix object-based audio or any combination of object-based audio and channel-based audio. For example, the content can be mixed using twelve speakers and MDA will map the content to any playback configuration, such as 5.1 or stereo. In this document, MDA will be referenced as one example for applicability to embodiments of the spatial normalization OBA loudness management system and method. However, other types of bitstream formats (e.g., DTS:X) may also be applicable to embodiments of the spatial normalization OBA loudness management system and method. While MDA can support objects, channels, and scene-based audio (higher-order ambisonics (HOA)), it should be noted that in this document MDA is mainly referring to an OBA payload.

II. Operational and System Overview

It is desirable to define new techniques or update existing techniques to deal with loudness as the audio production world migrates from channel-based audio to OBA. At the present time, however, there is no known or agreed upon method to measure the loudness of object audio in 3D space. In the near future, world industry experts, such as those in the EBU, will undoubtedly be exploring new methods to deal with loudness management when having an immersive audio payload, such as Objects, Channels+Objects, or HOA.

Not only is it desirable to update methods of loudness measurement to apply to OBA, but it is also desirable to design techniques that can define and determine a concrete and meaningful measurement of loudness without knowledge of the target rendering configuration. It is even better if the technique is able to calculate a measurement without having to render the objects. Embodiments of the spatial normalization OBA loudness management system and method accomplish these goals.

Global Summed Loudness

A metadata parameter, called a Global Summed Loudness value, may be defined within the program specific metadata of the MDA program bitstream. The Global Summed Loudness value may represent the total OBA program or mix's combined and measured loudness value. The only known method to achieve a value that would be understood by the audio industry today would be to send the audio object payload in the stream through a forced render to channel loop. Here the objects use the MDA reference renderer (such as vector base amplitude panning (VBAP), see FIG. 2) to render to the ITU defined 5.1 speaker layout configuration. This essentially turns all the objects into a 5.1 channel feed. Then, these objects are fed into an existing EBU R-128 or Advanced Television Systems Committee (ATSC) A85 compliant loudness measurement process. The measured value (measured in loudness, K-weighted, relative to full scale (LKFS) or loudness units relative to full scale (LUFS)) is then recorded back in the MDA bitstream at the bitstream level, and not individual object level (see FIG. 1) as the program's Global Summed Loudness value (for example, ITU5.1-23LUFS). This can also be applied to stereo.

Figure 3:
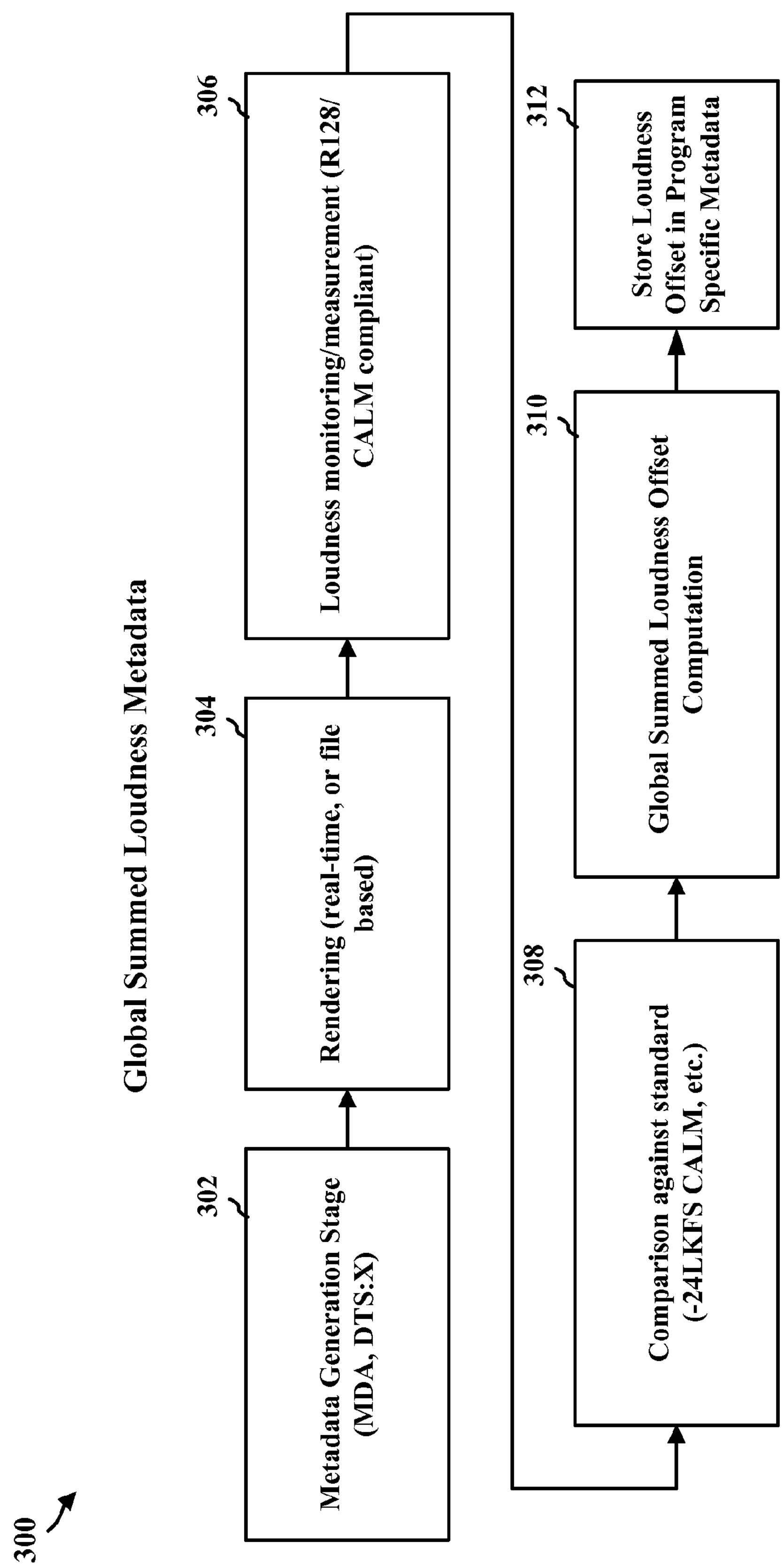
FIG. 3 is a block diagram illustrating an overview of the generation of global summed loudness metadata.

FIG. 3 is a block diagram 300 illustrating an overview of the generation of global summed loudness metadata. At 302, OBA metadata is generated in a metadata generation stage. Such metadata may be generated for MDA or DTS:X, for example. Subsequently, at 304, a rendering or pre-rendering may be performed on audio-object signals to determine an average power or loudness of each of the audio-object signals. At 306, loudness monitoring/measurements may be performed to determine a Global Summed Loudness value. Such monitoring/measurements may comply with EBU R-128 or the Commercial Advertisement Loudness Mitigation (CALM) Act. Once the Global Summed Loudness value is computed, at 308, the computed Global Summed Loudness value may then be compared to a target loudness level specified in international regulation standards, such as -24 LKFS in the CALM Act, or -23 LUFS in EBU R-128. The target loudness level may be carried in the program specific metadata within the MDA bitstream. Based on the comparison, at 310, an offset may be calculated and, at 312, that offset can be stored in the program specific metadata within the MDA bitstream as the Global Summed Loudness Offset. The Global Summed Loudness Offset can be applied later downstream when the audio is finally rendered for consumer playback.

Spatial Normalization Loudness Metric

Embodiments of the spatial normalization OBA loudness management system and method define and determine a concrete and meaningful loudness measurement without knowledge of the target rendering configuration (e.g., number of speakers, or speaker configuration). This is important since this will be the case for OBA content that is intended for consumer delivery and playback. Moreover, embodiments of the system and method compute this loudness measurement without having to render the objects.

Figure 4:
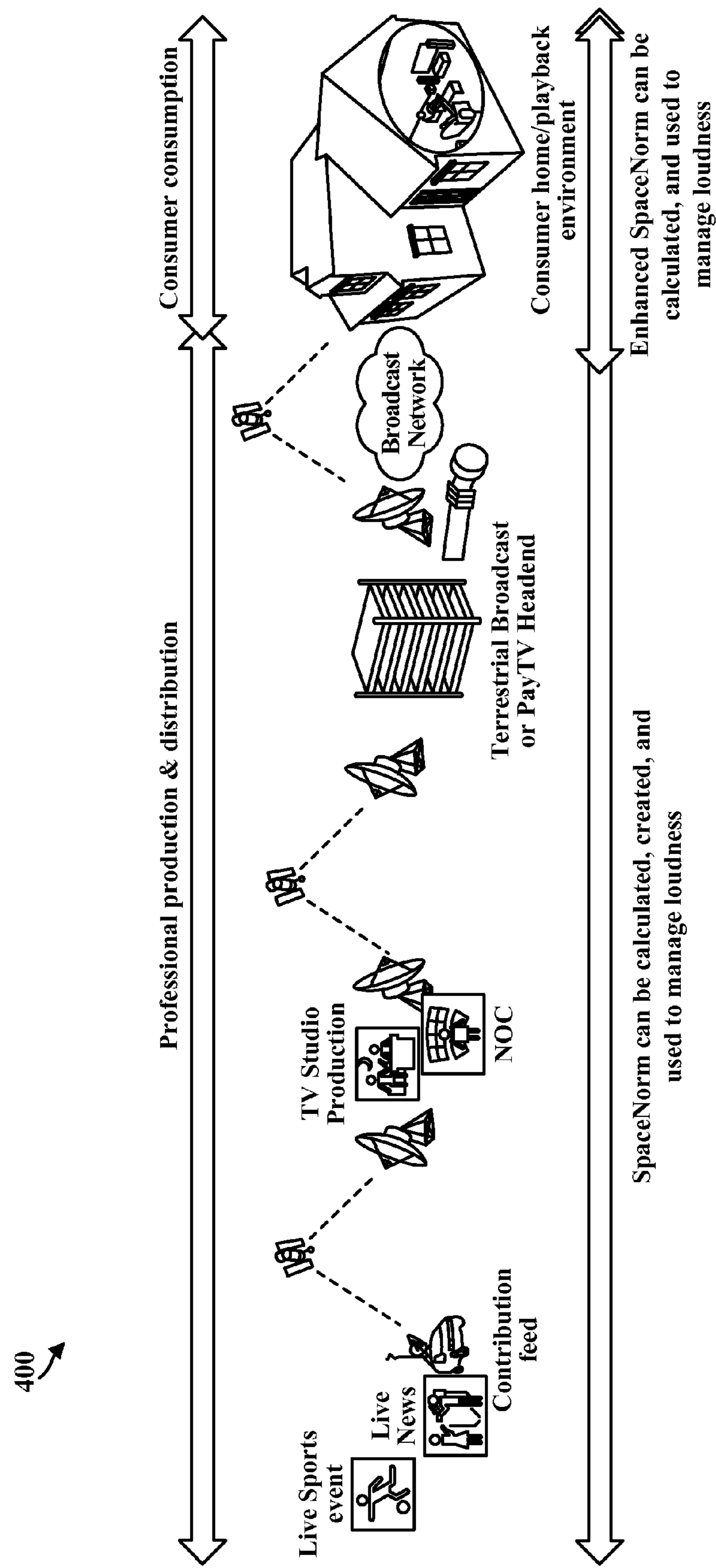
FIG. 4 is a block diagram illustrating the contemplated uses of the basic spatial normalization loudness metric and the enhanced spatial normalization loudness metric computed by embodiments of the spatial normalization OBA loudness management system and method.
Figure 5:
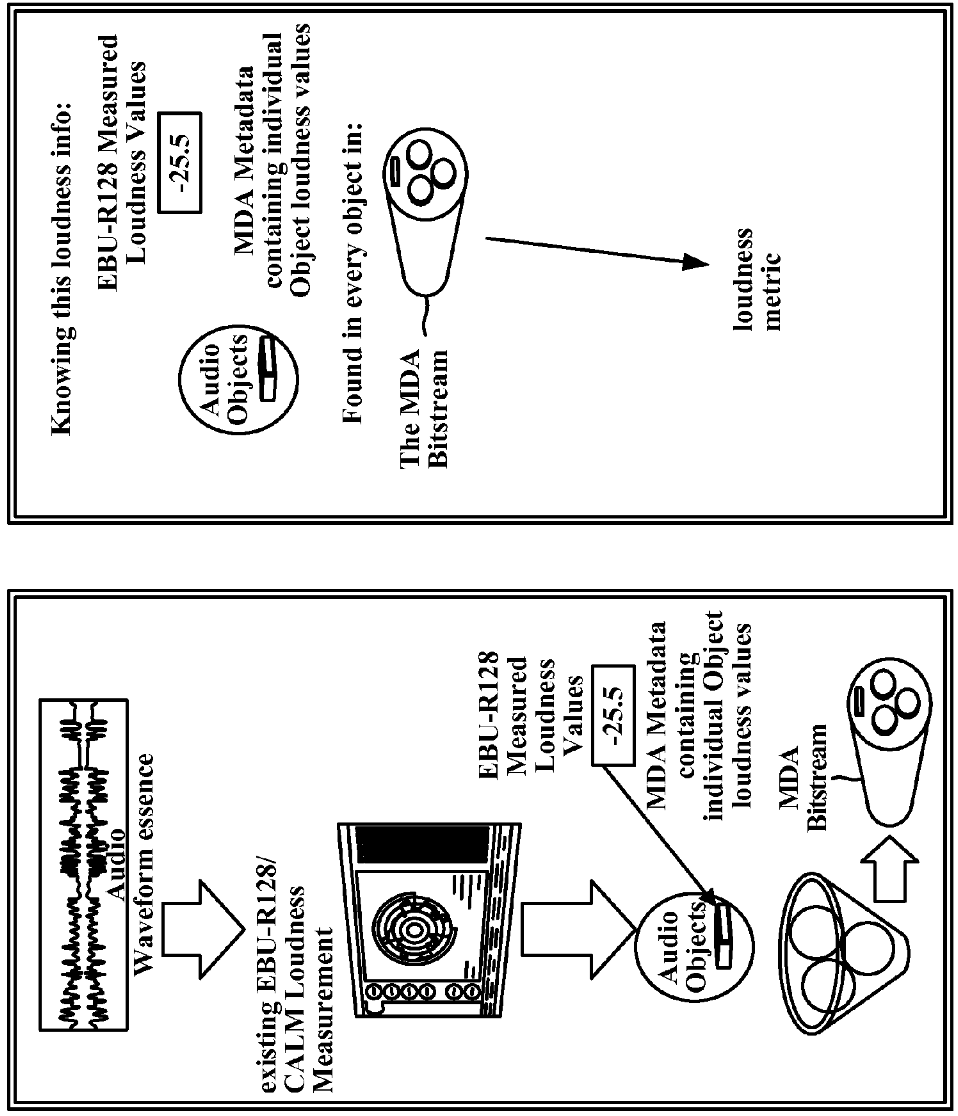
FIG. 5 is a block diagram illustrating an overview of the computation of the spatial normalization loudness metric shown in FIG. 4.

FIG. 4 is a block diagram 400 illustrating the contemplated uses of the basic spatial normalization loudness metric and the enhanced spatial normalization loudness metric computed by embodiments of the spatial normalization OBA loudness management system and method. FIG. 5 is a block diagram 500 illustrating an overview of the computation of the spatial normalization loudness metric shown in FIG. 4. The spatial normalization OBA loudness management system and method define two types of spatial normalization loudness metrics. A basic spatial normalization loudness metric may be computed knowing the final mix (i.e., all of the audio objects used to determine the loudness) and the target rendering environment. This alleviates the need for a fixed list of playback configurations and can be done at the last possible point in the chain in the consumer's home. The enhanced spatial normalization loudness metric may be computed based on additional information, such as listener location and orientation. The spatial normalization loudness metric can be determined at any given point in the broadcast production/delivery/playback chain.

Both techniques and values aim to solve two identified problems. The first problem is to provide broadcasters who are under strict national regulations to maintain loudness control and assure a consistent loudness experience for their consumers with content they deliver to the home. The second problem is to address the need to come up with new techniques for handling OBA delivery. In these situations, the application and requirements for such systems (such as new international broadcast standards) call for having flexibility to adapt to any given listener location/orientation in the home with respect to the audio object locations.

Embodiments of the spatial normalization OBA loudness management system and method allow the end-to-end chain to be smarter and more adaptable. Moreover, the system and method shift much of the heavy lifting to the headend or cloud-based architecture. Some algorithmic calculations are maintained on the consumer side to adapt to any given environment and any arbitrary mix, or modified mix (changed by consumer interactivity intervention via late binding or home network feeds). The system and method also factor in the specific consumer playback environment.

In situations where the basic spatial normalization loudness metric is used, broadcasters may employ many system components to spot-check, to validate, or to correct loudness of audio channels. Some are file-based systems and some use real-time equipment. The responsibilities of maintaining compliance (or not touching certain certified content) are passed on from one part of the distribution chain to the next via content rights contracts. Ultimately, laws are crafted to hold certain individual companies liable. In the United States, it is the programmers and broadcasters who originate the content. Tools are needed to verify, to check, or to adjust loudness while having minimal to no impact on audio quality (such as the dynamic range) of the originally-authored audio content. The exemplary system and method are a non-invasive way to "tap" the bitstream at any given point and get a calculation of the OBA program's loudness without having to render or to know the end user configuration.

In situations where the enhanced spatial normalization loudness metric is used, the exact listener position/orientation is known. In this environment, at the final stage of the delivery chain (in consumer home, see FIG. 4), the system has knowledge of where the objects are going to be rendered in the room, relative to the listener. This enhances the accuracy of the system and method and its calculations.

If proximity were used in the creation of the original mix, an advanced renderer that can leverage those effects also is used. Proximity can be used by embodiments of the system and method for even more accurate measurements and compensation. The system and method can also use any changes in the listener's position relative to the object's position in 3D listening space. This change is made known to the system and method through an environment feedback system. If additional information is available to embodiments of the system and method, it can calculate a "perceived" loudness level of all objects rendered in 3D space relative to the listener's point of view.

It is important to note and to understand that the basic spatial normalization loudness metric techniques and the enhanced spatial normalization loudness metric techniques are first and foremost a new measurement process. Embodiments of the system and method can be applied to the OBA bitstream at any given point in the chain, whether file-based or real-time. Both type of spatial normalization loudness metrics can be calculated at any point in the creation and distribution stage, and can be also inserted as metadata back into the OBA bitstream after it is calculated and created. In MDA, the spatial normalization loudness metric may replace the Global Summed Loudness value using the render to ITU 5.1 method.

The enhanced spatial normalization loudness metric may be calculated at the final point in the delivery chain, in the consumer playback environment. This is the point where more information is known to the system on the listener and final set of objects in the mix, after interactivity has taken place. The enhanced spatial normalization loudness metric can be designed into a real-time system in a consumer decoder of immersive audio. In addition, it can ultimately be used to correct any unwanted loudness inconsistencies. The system and method can be licensed and implemented into professional broadcast products that are designed to measure, to monitor, or to correct loudness problems in the broadcast headend workflow, without affecting the audio essence or artistic intent (via metadata correction only).

Broadly, embodiments of the OBA loudness management system and method contain techniques to measure loudness when the audio is in the form of audio objects in 3D space. Embodiments of the system and method make use of audio object metadata to create a new measured value and a new unit of reference of the OBA payload. Loudness issues exist in the world today, primarily in stream-type delivery of linear entertainment, such as broadcast linear programming, VOD, and OTT streaming Existing techniques merely manage loudness for traditional stereo and 5.1 channels scenarios.

The OBA loudness management system and methods allows content creators and distributors to measure and to reference a new value for payload loudness without rendering the audio objects. In addition, the playback configuration does not need to be known.

Current techniques lack the ability to measure immersive audio, such as OBA. Embodiments of the system and method use spatial information combined with individual object loudness/power information to create a new reference value, without needing to render the payload. The exemplary system and method use a bitstream that carries information on the position of the objects in 3D space and individual measured loudness during an object's creation. By way of example and not limitation, the bitstream may be an MDA bitstream or alternate OBA open specification. The exemplary system and method also includes a spatial normalization technique that calculates a spatial normalization loudness metric, given the information it needs (and without rendering).

In general, the spatial normalization loudness metric can be one of two types. In some embodiments, a basic spatial normalization loudness metric is used that can be calculated at any given time by assuming a particular listener position/orientation with respect to the location of the audio objects. This is true both in a file-based environment and a real-time environment. In other embodiments, an enhanced spatial normalization loudness metric is used. In these embodiments the listener's position/orientation is known. As compared to the basic spatial normalization loudness metric, the enhanced spatial normalization loudness metric is able to create a more accurate and personalized perceived loudness value. This enhanced loudness metric then can be used to manage any loudness inconsistencies during a program, or from program to program, or program to commercial. The enhanced spatial normalization loudness metric can also take into account a variety of other loudness-relevant information. By way of example and not limitation, this loudness-relevant information includes proximity information. In addition, in some embodiments the enhanced loudness metric can account for any consumer side interactivity and where the content is remixed (by adding an object into the mix, by dropping an object from the mix, or by changing a location of an object in the mix (e.g., by moving an object to a different location or panning an object in the mix)—all of which changes the entire loudness of the mix).

The basic spatial normalization loudness metric will take shape as professional broadcast equipment code that is licensed into professional products that make audio creation, processing, and encoding/decoding/transcoding equipment. It can be built into standalone tools (hardware boxes or software), into other third-party tools, into encoders, or as part of server based or cloud-based processing equipment that conditions and normalizes audio.

The enhanced spatial normalization loudness metric may be used as part of integrated licensed consumer solutions (codec suite or post-processing). These tools are part of broadcast and OTT preparation for delivery and playback solutions today. Client-side implementations of the enhanced spatial normalization loudness metric include decoders and players implemented in multi-screen applications such as PCs, tablets, mobile smartphones, televisions, and set-top boxes. Moreover, these devices do not even need loudspeakers, as headphone playback is also applicable.

III. Operational and System Details

The spatial normalization OBA loudness management system and method describe the loudness measurement and management in OBA. The metadata associated with each audio object can be, for example, the location of the object in 3D space, a waveform amplitude scaling factor to be applied to the waveform when rendering the object, data about the correlation relationship of the objects involved, or temporal information about the object such as when it starts and when it ends. In the following discussion, the system and method will be discussed in the context of three stages: a) content creation (or encoding) stage, b) intermediate monitoring stage, and c) content consumption stage.

Metadata Encoding Stage

Figure 6:
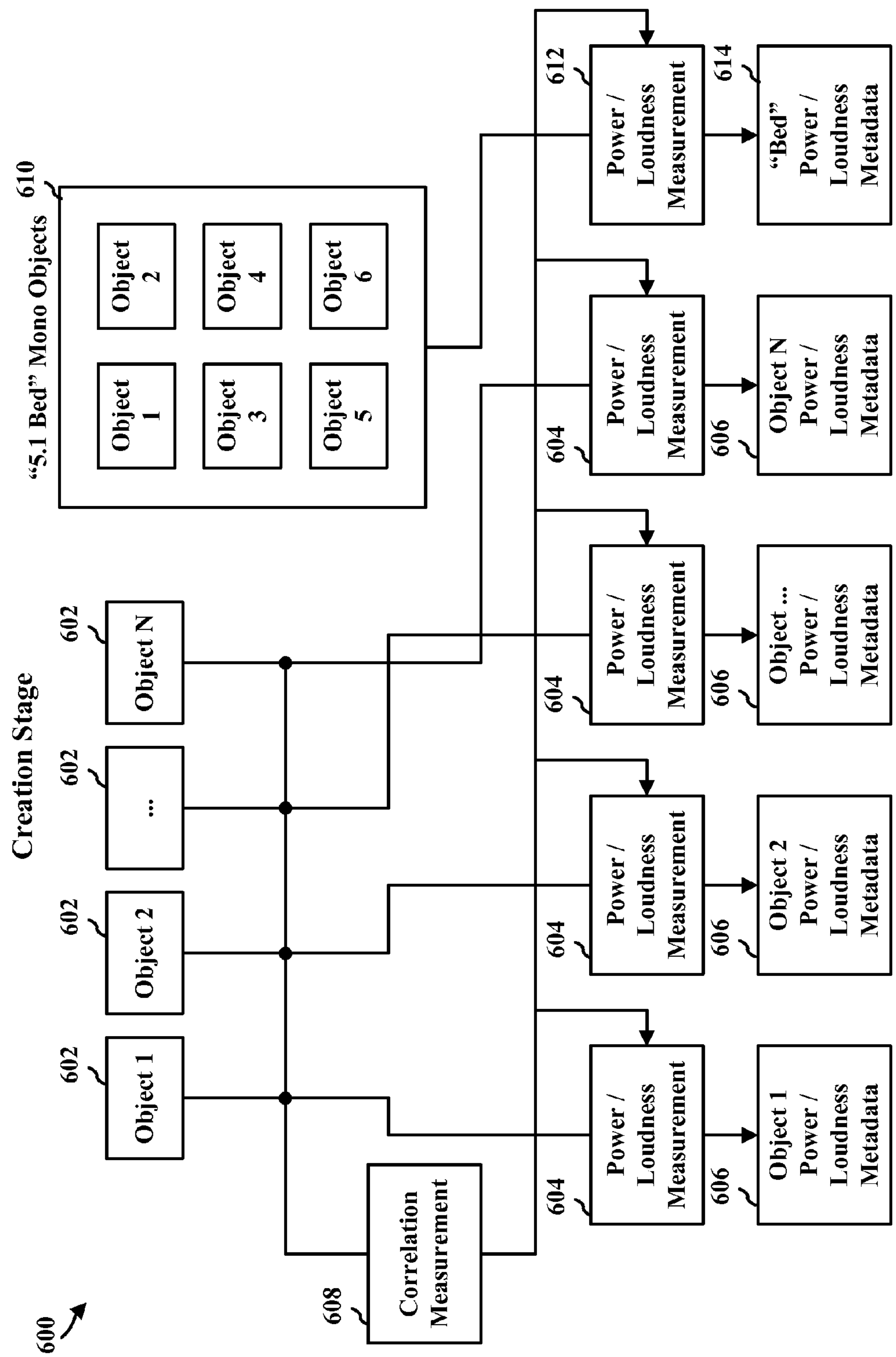
FIG. 6 is a block diagram illustrating an overview of the content creation/encoding stage.

FIG. 6 is a block diagram 600 illustrating an overview of the content creation/encoding stage. During the creation stage, metadata that is associated with each audio object (602) (such as the power, or loudness of each audio object) is measured (604) by performing some type of "pre-rendering" of the bitstream. Short, intermediate, or file-based measurements can be made at this stage. The power measurement $z_i$ for an input signal $y_i$ is defined as follows over a period of time T:

$$z_i = 1/T \int_0^T y_i^2 dt, \quad (1)$$

where i∈I, and I is the set of audio-object signals. The power measurement information may be stored as metadata (606) with the audio object signals. The power measurement information may alternatively be stored as loudness information. Additional information may be stored as object-specific metadata, including gain/amplitude, audio-object location, and a listener's location/orientation. Processing of the power/loudness measurement metadata information for audio objects is described infra in relation to the monitoring stage.

Monitoring Stage

If I is the set of input channels for power measurements of channels (not audio objects), mapping of the measured power to a loudness value may be done by means of a log transformation:

$$\text{Loudness},L_K = -0.691 + 10\log_{10}\Sigma_i^N G_i z_i LKFS, \quad (2)$$

where $G_i$ is a weighting coefficient for the $i^{th}$ audio-object signal.

For intermediate loudness measurements, a gated, overlapping type (which may be set to 75%) of transformation can be used:

$$\text{Gated Loudness}, L_{KG} = -0.691 + 10\log_{10}\Sigma_i G_i\left(\frac{1}{|J_g|}\Sigma_{J_g} z_{ij}\right) LKFS, \quad (3)$$

where $J_g$ is a set of block indices where the gating block loudness is above the gating threshold typically taken at −70 dBFS and $|J_g|$ is a number of elements in $J_g$:

$$J_g = \{j : l_j > \Gamma_a\}, \Gamma_a = -70LKFS \quad (4).$$

For single-channel waveform object loudness measurements, the summations in the equations supra collapse to 1 (i.e., N=1) and the scaling coefficient $G_1$ may be set to 1.0. In some embodiments, for a group of single-channel objects representing a multi-channel audio signal where each channel is assigned to a fixed location in space (referred to as a multi-channel "bed"), the scaling coefficients $G_i$ in the equations supra can be mapped to per-channel weights found in the BS.1770-x specifications and defined only for standard multi-channel loudspeaker playback configurations, such as the "5.1" configuration. Power/loudness measurements (612) may be performed on the single-channel objects (610) and stored as metadata (614). It should be noted here that a pre-filtering stage may be applied before the loudness measurement is taken. This can include filters to account for the acoustic effects of the head and revised low frequency B-weight filters. Once the power/loudness information per object is measured, the measured value is then stored as metadata that can be used later on. In addition, metadata representing correlation of objects can be computed (608) at this stage that can later facilitate calculations of the spatial normalization loudness metric. The correlation of objects represents auditory masking that occurs when the perception of one sound is affected by the presence of another sound. In the frequency domain, auditory masking may be referred to as simultaneous masking, frequency masking, or spectral masking. In the time domain, auditory masking may be referred to as temporal masking or non-simultaneous masking.

During the monitoring stage, the per-object power/loudness metadata information is retrieved (see Equation (1)) and is used to compute a global loudness value. The retrieved individual power/loudness measurements are combined/summed in order to derive a global loudness measurement. In addition, the individual measurements can be scaled based on weight metadata information per object before being combined/summed. The combined/summed global loudness measurement is defined as the spatial normalization loudness metric (also referred to as SNM). It should be understood that the spatial normalization loudness metric can be computed either in a power or loudness-mapped format.

Equations (2) and (3), set forth supra, describe loudness measurements per channel or a group of channels. Equations (2) and (3) can now be generalized to generate spatial normalization loudness metric measurements per audio object or a group of audio objects.

In particular, the determination of the spatial normalization loudness metric (SNM) over interval T can be generalized as follows:

$$SNM=-0.691+10\log_{10}\Sigma_i^N FJJT(r_i,r_L,\theta_i,\varphi_i,a_i,g_i,c_i)z_i \quad (5),$$

where $i\in I$, I is the set of audio-object signals, and N is the number of audio-object signals in the set I of audio-object signals.

The determination of the gated spatial normalization loudness metric (gated SNM) over interval T can be generalized as follows:

$$\text{gated } SNM = -0.691+10\log_{10}\Sigma_i^N FJJT(r_i,r_L,\theta_i,\phi_i,a_i,g_i,c_i)\left(\frac{1}{|J_g|}\sum_{J_g} z_{ij}\right), \quad (6)$$

where $i\in I$, I is the set of audio-object signals, and N is the number of audio-object signals in the set I of audio-object signals.

For the gated SNM, the interval T is divided into a set of overlapping gating block intervals. A gating block is a set of contiguous audio samples of duration $T_g$, which may have a duration of 400 ms. The overlap of each gating block may be 75% of the gating block duration $T_g$. With a 75% overlap and a window duration of 400 ms, the gated SNM is determined based on 300 ms of an audio-object signal used in a previous calculation of the gated SNM. As such, with a 75% overlap and a window duration of 400 ms, the gated SNM is determined every 100 ms.

It can be seen that the generalized equations (5) and (6) are derived from equations (2) and (3) by introducing the function FJJT, which is defined as follows:

$$FJJT(r_i,r_L,\theta_i,\phi_i,a_i,g_i,c_i)=c_ia_ig_i\left(\frac{1}{|\vec{r}_i-\vec{r}_L|^2}\right)O(\theta_i,\phi_i), \quad (7)$$

where $c_i$ is the correlation factor of the $i^{th}$ object and is a correlation measure of a audio masking of the $i^{th}$ object by one or more of the other N−1 objects, $a_i$ is the amplitude scaling factor (scaling factor to obtain intended amplitude of the audio-object signal) of the $i^{th}$ object carried in the metadata stream, $$\frac{1}{|\vec{r}_i-\vec{r}_L|^2}$$

is optional and follows the inverse square relative distance law of the $i^{th}$ object and the listener, and $g_i$ is an optional frequency dependent weight factor that accounts for the human hearing loudness sensitivity as a function of the angular location of sound with respect to the head, and relative to an assumed look-direction (which typically coincides with the position of the "front center" channel). This weight factor can be thought of as a generalized form of the pre-filtering stage described in BS.1770-x designed to account for the acoustic effects of the head. The correlation factor $c_i$ may be inversely related to audio masking. For example, when there is no audio masking, the correlation factor $c_i$ may be 1, and when there is 100% audio masking, the correlation factor $c_i$ may be 0.

Figure 7:
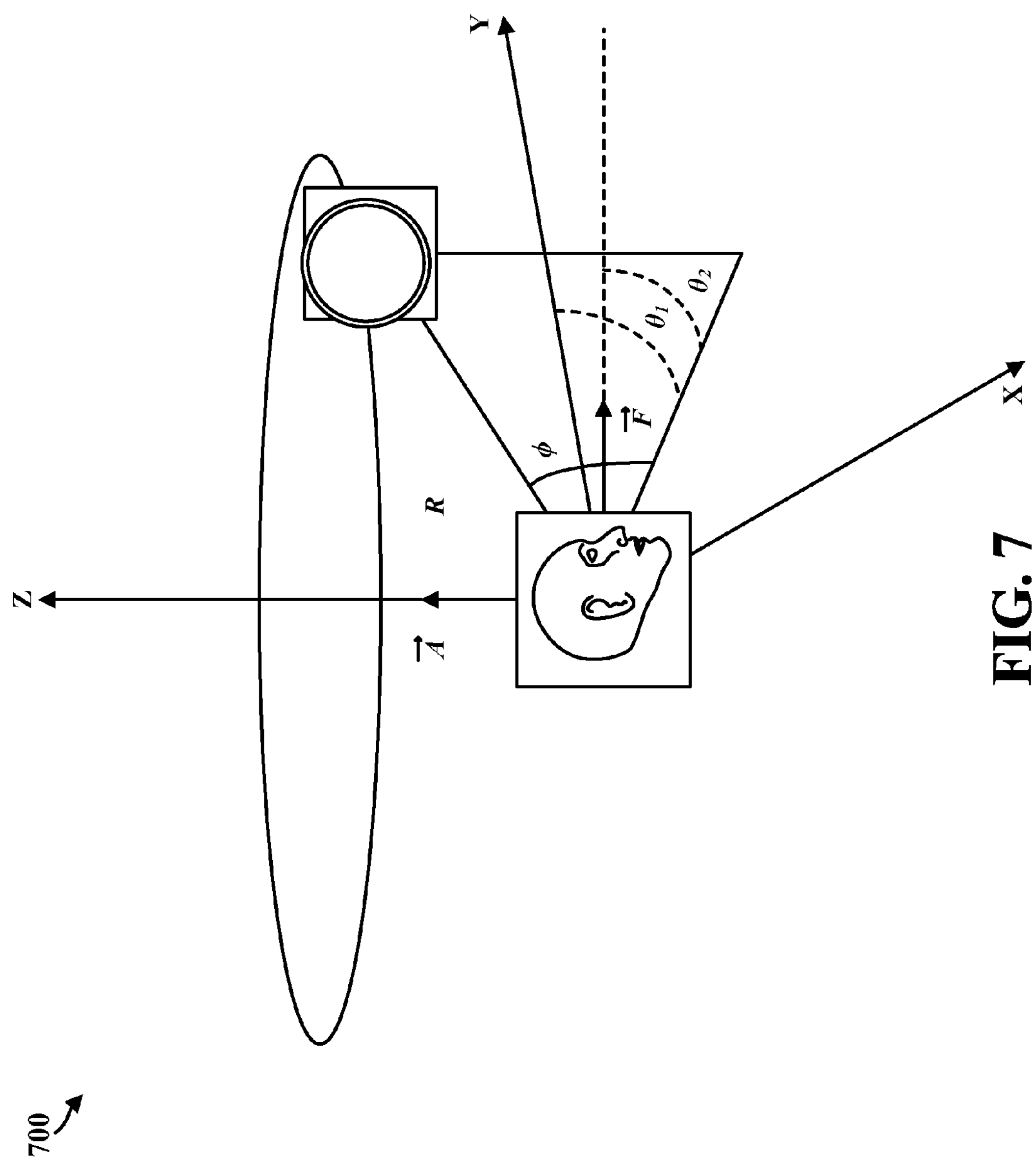
FIG. 7 is a diagram illustrating the orientation and geometry of a listener's head relative to an object and used during a monitoring stage in association with the spatial normalization OBA loudness management system and method.

$O(\theta_i, \varphi_i)$ is an additional correction factor that is tied to the weight factor $g_i$ described supra. $O(\theta_i, \varphi_i)$ utilizes cross-product right and up vectors $\vec{R}=\vec{F}\times\vec{A}$ and $\vec{U}=\vec{R}\times\vec{F}$, respectively, that describe the geometry of the listener head relative to the $i^{th}$ object as shown in FIG. 7. As shown in FIG. 7, the direction of a Right Vector is along the direction of the listener's right ear pointing out of his head. The direction of the Up Vector is above the listener's head.

When there is a relative listener to object azimuth (θ)/elevation (φ) change described by the angle transformations $$\theta-\left(\theta_R-\frac{\pi}{2}\right)$$

and $\varphi_{orientation}=\varphi-\varphi'$ that are described relative to the Right Vector and Up Vector, then the $O(\theta_i, \varphi_i)$ computes a correction scaling factor for the loudness of the $i^{th}$ object.

In addition, a table of discrete outputs of the continuous function $O(\theta_i, \varphi_i)$ can be generated for various pairs of azimuth and elevation and that table can be looked up when an orientation weight factor needs to be calculated. It should be noted that $O(\theta_i, (\varphi_i)=1$ for the default front-center position (corresponding to a typical front-center speaker location). Both the relative distance and orientation factors can be set to 1 at this stage and can be optionally recalculated at the consumer device stage described below.

Note that the location of the $i^{th}$ object is the intended location for the audio-object signal (e.g., effect, dialog, instrument, music, background, etc.) with respect to the head of a listener and is independent of a playback speaker configuration. The head of a listener may be referred to as a reception point at which all the objects when rendered are intended to be received. For example, a particular effect of an audio-object signal i may be intended to be located at an azimuth of $\theta_i$ and an elevation of $\varphi_i$ relative to an intended reception point. For another example, at the azimuth of $\theta_i$ and an elevation of $\varphi_i$ relative to the reception point, such particular effect of the audio-object signal i may have an intended distance $|\vec{r}_i - \vec{r}_L|$ from the reception point.

It should be note that this is a "loudness monitoring" operation. In other words, there is not necessarily any OBA rendering taking place at this stage. It is an essential advantage of the spatial normalization OBA loudness management system and method that it enables measuring the loudness of OBA content without requiring any audio waveform decoding and power or loudness calculation. Instead, the spatial normalization loudness metric calculation is considerably facilitated and simplified thanks to the provision of per-object loudness metadata in the OBA content format and the calculation method described supra.

Consumer Device (Consumption) Stage

In this final stage, the global summed loudness, or spatial normalization loudness metric, can be recalculated (if necessary) in order to account for any of object creation, object deletion, object modification (e.g. attenuation), or listener location or head-orientation changes. This update can include, but is not limited to, relative distance and orientation updates per the corresponding description given in the monitoring stage.

Global Summed Loudness Metadata

In some embodiments a global summed loudness metadata value is computed during the production of the audio stream (such as MDA or DTS:X). This is done by using a reference renderer (such as VBAP) to render the stream to a target configuration (such as but not limited to ITU 5.1). Once the stream is rendered, existing loudness monitoring/measurement tools may be used that are R128/CALM compliant to measure the loudness properties of the rendered stream. These properties can include, but are not limited to, instantaneous loudness, short-term loudness, true peak, and loudness range, and can be measured with or without usage of anchor elements such as dialog.

These measurements can be weighted per loudness model specifications such as BS.1770-x, but are not limited to follow such weights. In addition, correlation measurements can be taken to identify the correlation relationship of the rendered signals, and based on the correlation relationship models other than the power sum of BS.1770-x, can be employed to compute overall loudness. Once the loudness is computed, the computed loudness is then compared to international regulation standards, such as -24 LKFS in CALM Act, or -23 LUFS in EBU R-128. Based on this comparison, an offset is calculated and that offset is the global summed loudness that is then saved as metadata value to the stream being produced.

It should be noted here that the global summed loudness is likely to be overwritten when enhanced spatial normalization loudness metric is employed. This is because of the additional dynamic information utilized in such cases.

IV. Alternate Embodiments and Exemplary Operating Environment

Many other variations than those described herein will be apparent from this document. For example, depending on the embodiment, certain acts, events, or functions of any of the methods and algorithms described herein can be performed in a different sequence, can be added, merged, or left out altogether (such that not all described acts or events are necessary for the practice of the methods and algorithms). Moreover, in certain embodiments, acts or events can be performed concurrently, such as through multi-threaded processing, interrupt processing, or multiple processors or processor cores or on other parallel architectures, rather than sequentially. In addition, different tasks or processes can be performed by different machines and computing systems that can function together.

Figure 8:
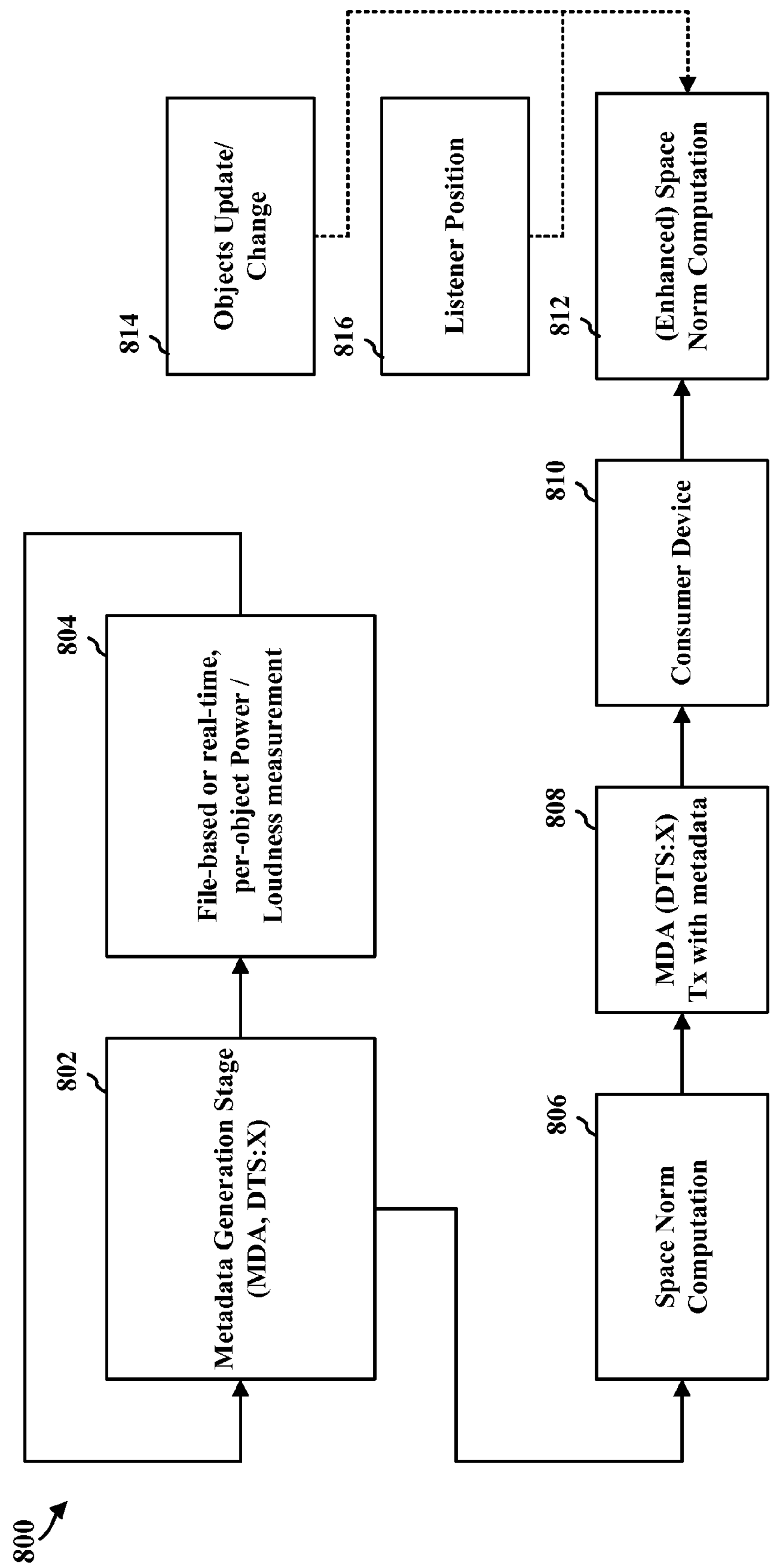
FIG. 8 is a flow diagram illustrating the general operation of all three stages of embodiments of the spatial normalization OBA loudness management system and method.

FIG. 8 is a flow diagram 800 illustrating the general operation of all three stages of embodiments of the spatial normalization OBA loudness management system and method. In the metadata generation stage 802, metadata is generated for the audio objects within a program bitstream. Such metadata may include information used in equations 1 and 5-7, as discussed supra. In block 804, power/loudness measurements are performed. The power/loudness measurements may be performed according to equation 1. The power/loudness measurements themselves may be stored in the metadata for the audio objects. Subsequently, at block 806, a spatial normalization loudness metric may be determined. The spatial normalization loudness metric may be determined based on the metadata and assumptions about the position/location of a listener with respect to the audio objects. For example, the listener may be assumed to be in position 0,0,0 in 3D space with respect to the audio objects, which are located around the listener at a particular radius/distance. Subsequently, at 808, the audio objects are transmitted (e.g., streamed, sent by file delivery, broadcasted) to a consumer device 810. At the consumer device, at 812, the spatial normalization loudness metric may be re-determined based on audio objects included in the mix. For example, a listener may update 814 (e.g., add, delete) audio objects from the mix or change audio objects in the mix. At 812, an enhanced spatial normalization loudness metric may be determined based on additional information, such as updated listener position 816. For example, a listener may change his/her location when listening to the audio objects such that the listener is no longer at position 0,0,0 in the 3D space, or the listener may change his/her head orientation by lying down rather than sitting up. The enhanced spatial normalization metric may be determined based on updated elevation, azimuth, and location information of the listener with respect to intended locations of audio objects.

Figure 9:
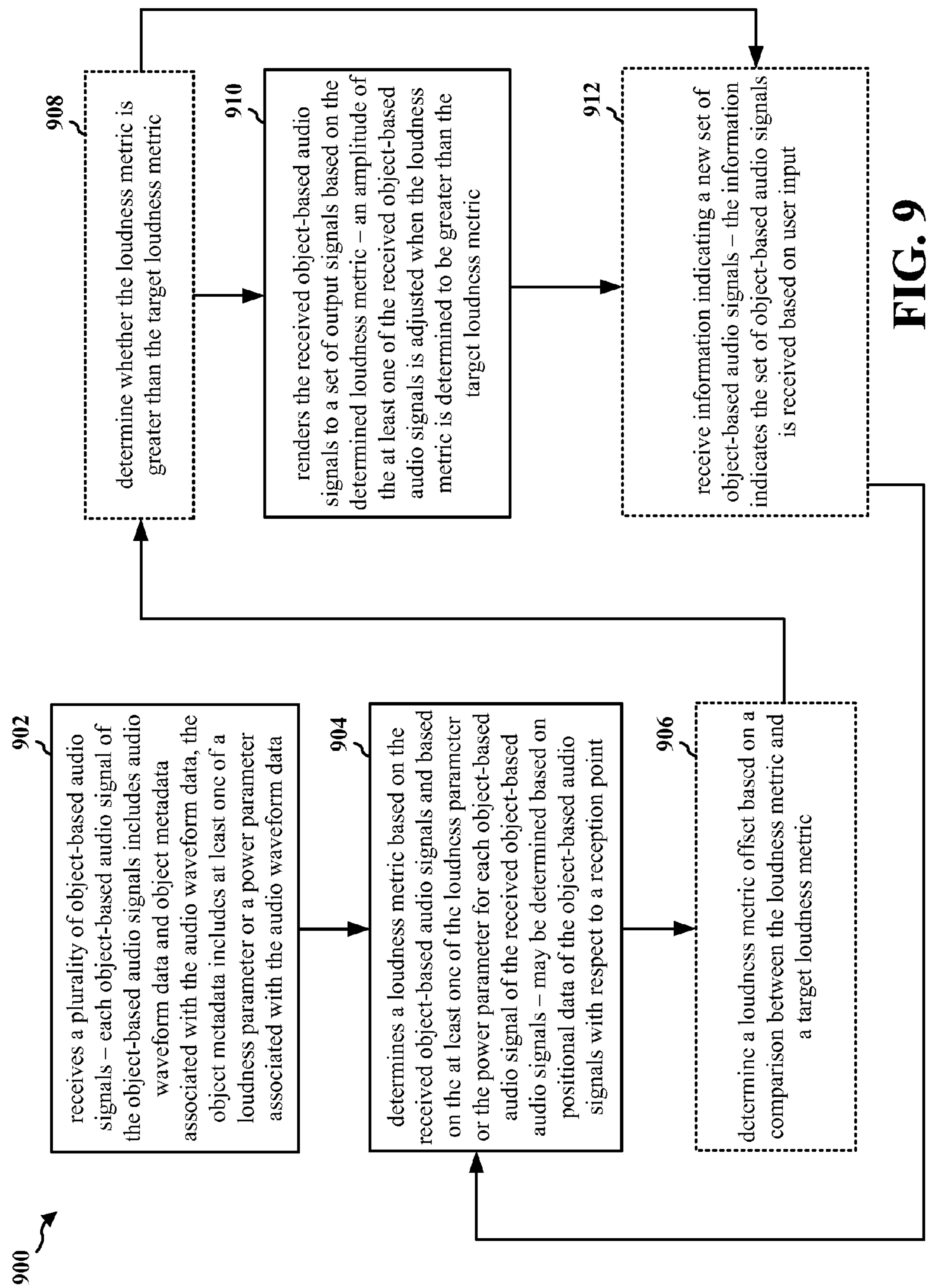
FIG. 9 is a flow chart of a method of processing object-based audio signals for reproduction through a playback system.

FIG. 9 is a flow chart 900 of a method of processing object-based audio signals for reproduction through a playback system. The method may be performed by a processor, such as a central processing unit (CPU). The processor may be within the playback system, or may be within a system that processes object-based audio signals for later reproduction through a playback system. The processor is referred to as an apparatus in FIG. 9. At 902, the apparatus receives a plurality of object-based audio signals. Each object-based audio signal of the object-based audio signals includes audio waveform data and object metadata associated with the audio waveform data. The object metadata includes at least one of a loudness parameter or a power parameter associated with the audio waveform data. For example, the object metadata may include power parameters $z_i$, as discussed supra. Alternatively, the object metadata may include loudness parameters (in LKFS or LUFS) that are a function of the power parameters $z_i$. At 904, the apparatus determines a loudness metric based on the received object-based audio signals and based on the at least one of the loudness parameter or the power parameter for each object-based audio signal of the received object-based audio signals. For example, the apparatus may determine a spatial normalization loudness metric based on equations 5, 6, and 7. At 910, the apparatus renders the received object-based audio signals to a set of output signals based on the determined loudness metric.

In one configuration, at 910, when rendering of the received object-based audio signals, the apparatus may adjust an amplitude $a_i$ of at least one of the received object-based audio signals based on the determined loudness metric. For example, at 906, the apparatus may determine a loudness metric offset based on a comparison between the loudness metric and a target loudness metric. The target loudness metric may be a target loudness level specified in international regulation standards, such as -24 LKFS in the CALM Act, or -23 LUFS in EBU R-128, as discussed supra. The amplitude $a_i$ of the at least one of the received object-based audio signals may be adjusted based on the comparison between the loudness metric and the target loudness metric. Specifically, at 908, the apparatus may determine whether the loudness metric is greater than the target loudness metric. In 908, when the loudness metric is determined to be greater than the target loudness metric, in 910, the apparatus may adjust/scale the amplitude $a_i$ of the at least one of the received object-based audio signals so that the loudness is reduced to approach the target loudness metric.

In one configuration, the loudness metric is determined further based on, for each object-based audio signal of the received object-based audio signals, positional data of the object-based audio signal with respect to a reception point. The reception point may be an assumed reception point, such as 0,0,0 in 3D space, or an actual location of a listener within a 3D space. The positional data of the object-based audio signal is an intended location of the object-based audio signal with respect to the 0,0,0 reception point. For example, a first object-based audio signal may be intended to be located to the right of a listener, at a first elevation and first azimuth with respect to the reception point, and a second object-based audio signal may be intended to be located to the left of a listener, at a second elevation and second azimuth with respect to the reception point.

In one configuration, the positional data includes at least one of an azimuth between a location of the object-based audio signal and the reception point, or an elevation between the location of the object-based audio signal and the reception point. The positional data may further include a distance between the location of the object-based audio signal and the reception point. In one configuration, all object-based audio signals may be assumed to have a fixed distance/radius from the reception point 0,0,0.

In one configuration, the loudness metric is determined further based on, for each object-based audio signal of the received object-based audio signals, at least one of a correlation factor $c_i$ of the object-based audio signal with respect to one or more other object-based audio signals of the received object-based audio signals, an amplitude scaling factor $a_i$ of the object-based audio signal, or a frequency dependent weight factor g of the object-based audio signal to account for hearing loudness sensitivity as a function of an angular location of the object-based audio signal with respect to a reception point.

In one configuration, the loudness metric is determined based on $\Sigma_i^N \mathrm{FJJT}(r_i, r_L, \theta_i, \varphi_i, a_i, g_i, c_i) z_i$, where $i \in I$, I is the set of object-based audio signals, N is a number of object-based audio signals in the received object-based audio signals, $z_i$ is said at least one of the loudness parameter or the power parameter for an $i^{th}$ object-based audio signal, $r_i$ is a location associated with the $i^{th}$ object-based audio signal, $r_L$ is a location associated with a reception point, $\theta_i$ is an azimuth between the location of the $i^{th}$ object-based audio signal and the reception point, $\varphi_i$ is an elevation between the location of the $i^{th}$ object-based audio signal and the reception point, $a_i$ is an amplitude scaling factor of the $i^{th}$ object-based audio signal, $g_i$ is a frequency dependent weight factor of the $i^{th}$ object-based audio signal to account for hearing loudness sensitivity as a function of an angular location of the $i^{th}$ object-based audio signal with respect to the reception point, and $c_i$ is a correlation factor of the $i^{th}$ object-based audio signal with respect to one or more other object-based audio signals of the received object-based audio signals.

In one configuration, the received object-based audio signals are user-specified. That is, a user may add, delete, or otherwise change the object-based audio signals. As such, at 912, the apparatus may receive information indicating a new set of object-based audio signals. The information indicating the set of object-based audio signals is received based on user input. Subsequently, the apparatus may re-determine (904) the loudness metric based on the set of object-based audio signals and based on the at least one of the loudness parameter or the power parameter for each object-based audio signal of the set of object-based audio signals.

As discussed supra, the object metadata of each object-based audio signal includes at least one of positional data of the object-based audio signal with respect to a reception point, or an amplitude scaling factor of the object-based audio signal. The positional data of the object-based audio signal with respect to the reception point may include at least one of a distance between a location of the object-based audio signal and the reception point, an azimuth between the location of the object-based audio signal and the reception point, or an elevation between the location of the object-based audio signal and the reception point.

In one configuration, the loudness metric is an average loudness over T ms, and the loudness metric is determined every T ms. In one configuration, the loudness metric is an average loudness over T ms, and the loudness metric is determined every D ms where $D<T$. For example, the loudness metric may be an average loudness over 400 ms, and the loudness metric may be determined every 100 ms. In one configuration, the loudness metric is determined over a plurality of window periods, each of which overlap with a previous window. For example, each of the window periods may have a duration of 400 ms and overlap other window periods by 300 ms.

In one configuration, the received object-based audio signals include N object-based audio signals, the received object-based audio signals are rendered through speakers having n channels, and N is uncorrelated with n. In particular, the number of object-based audio signals N is completely uncorrelated with the number of channels n.

Referring again to 910, in one configuration, after adjusting/modifying the amplitude, if needed, of one or more of the received object-based audio signals, the apparatus may map object-based audio signals to particular speakers (or channels) when generating the set of output signals. Each object-based audio signal may be mapped to a closest set of speakers (e.g., three speakers in triangle pattern) based on the location of the object-based audio signal and based on speaker locations that are closest to the object-based audio signal. In another configuration, the set of output signals are provided to another apparatus that performs the mapping to particular speakers (channels).

Figure 10:
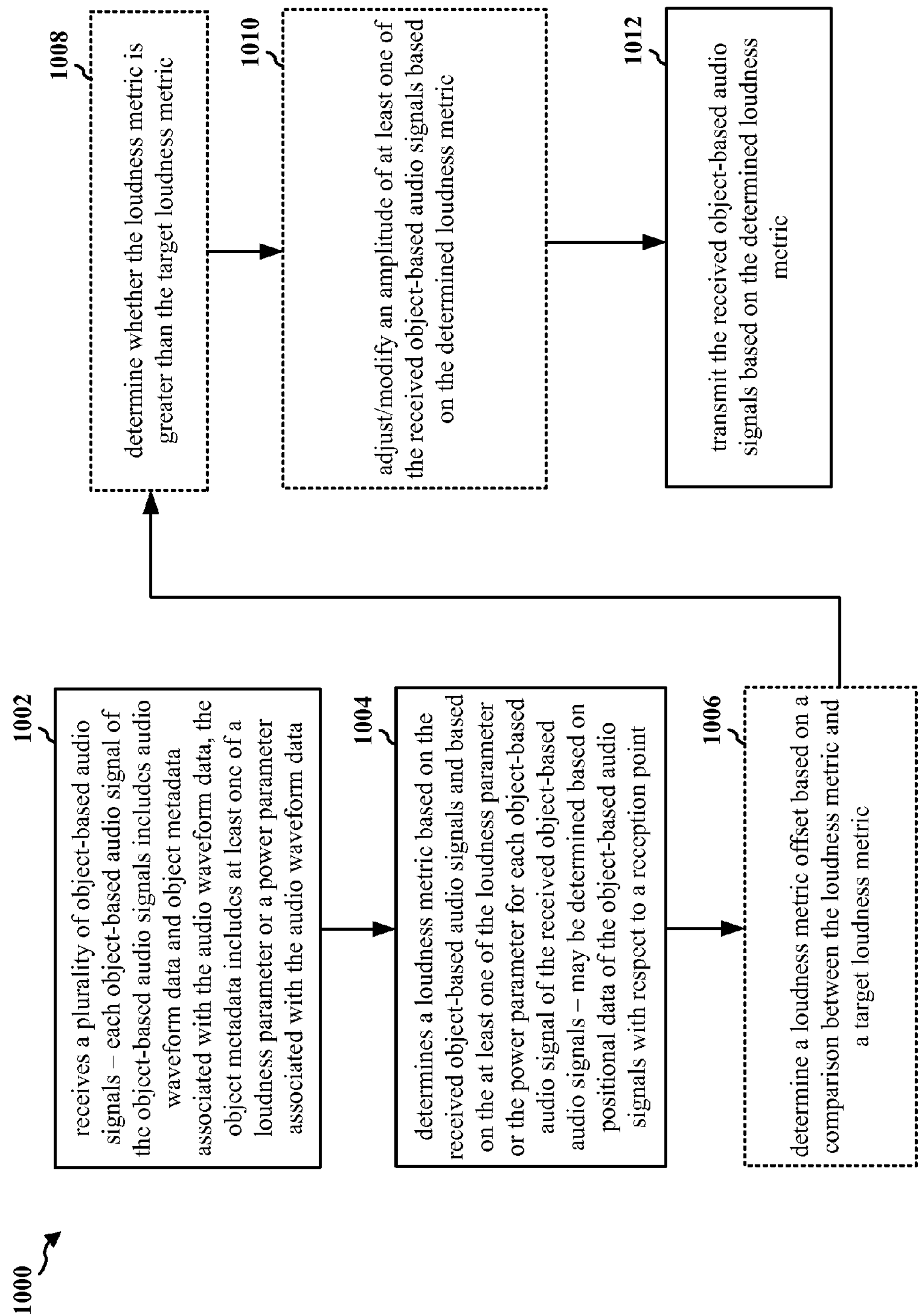
FIG. 10 is a flow chart of a method of processing object-based audio signals for at least one of broadcast, file delivery, or streaming.

FIG. 10 is a flow chart 1000 of a method of processing object-based audio signals for at least one of broadcast, file delivery, or streaming. The method may be performed by a processor, such as a CPU. The processor is referred to as an apparatus in FIG. 10. At 1002, the apparatus receives a plurality of object-based audio signals. Each object-based audio signal of the object-based audio signals includes audio waveform data and object metadata associated with the audio waveform data. The object metadata includes at least one of a loudness parameter or a power parameter associated with the audio waveform data. At 1004, the apparatus determines a loudness metric based on the received object-based audio signals and based on the at least one of the loudness parameter or the power parameter for each object-based audio signal of the received object-based audio signals. At 1012, the apparatus transmits the received object-based audio signals based on the determined loudness metric.

In one configuration, at 1006, the apparatus may determine a loudness metric offset based on a comparison between the loudness metric and a target loudness metric. At 1008, the apparatus may determine whether the loudness metric is greater than the target loudness metric. If the loudness metric is determined to be greater than the target loudness metric, at 1010, the apparatus may adjust an amplitude of at least one of the received object-based audio signals based on the determined loudness metric. Subsequently, at 1012, the apparatus may then transmit the received object-based audio signals with the adjusted amplitude of the at least one of the received object-based audio signals. Alternatively, at 1010, the apparatus may modify an amplitude of at least one of the received object-based audio signals in program specific metadata of a program bitstream based on the determined loudness metric. Subsequently, at 1012, the apparatus may transmit the received object-based audio signals with the modified amplitude in the program specific metadata.

Figure 11:
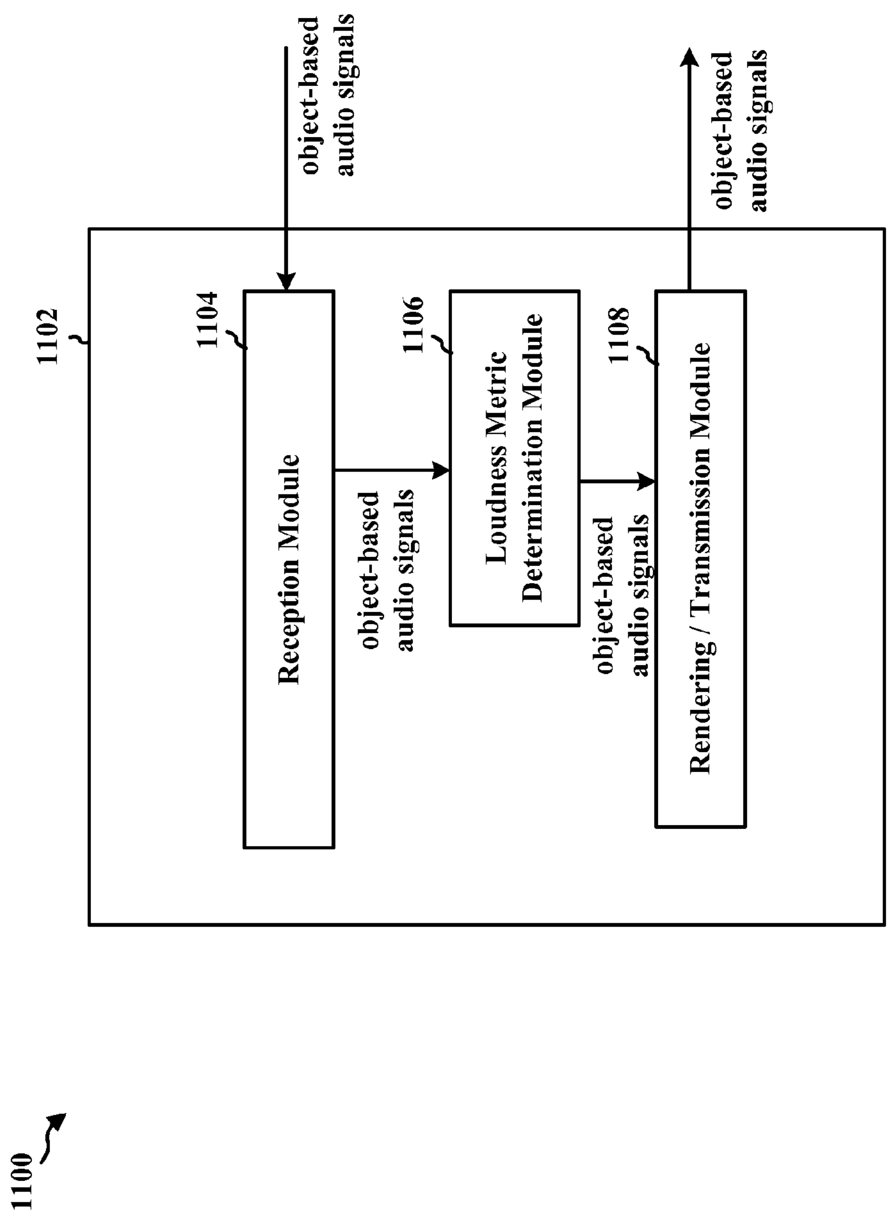
FIG. 11 is a conceptual data flow diagram illustrating the data flow between different modules/means/components in an exemplary apparatus.

FIG. 11 is a conceptual data flow diagram 1100 illustrating the data flow between different modules/means/components in an exemplary apparatus 1102. The apparatus is for processing object-based audio signals for reproduction through a playback system or for transmission through broadcast, file delivery, or streaming. The apparatus 1102 includes a reception module 1104 that is configured to receive a plurality of object-based audio signals. Each object-based audio signal of the object-based audio signals includes audio waveform data and object metadata associated with the audio waveform data. The object metadata includes at least one of a loudness parameter or a power parameter associated with the audio waveform data. The apparatus 1102 further includes a loudness metric determination module 1106 that is configured to determine a loudness metric based on the received object-based audio signals and based on the at least one of the loudness parameter or the power parameter for each object-based audio signal of the received object-based audio signals. The apparatus 1102 further includes a rendering/transmission module 1108 that may be configured to render the received object-based audio signals to a set of output signals based on the determined loudness metric. Alternatively, the rendering/transmission module 1108 is configured to transmit the received object-based audio signals based on the determined loudness metric.

In one configuration, the rendering/transmission module 1108 is configured to adjust an amplitude of at least one of the received object-based audio signals based on the determined loudness metric. In one configuration, the loudness metric determination module 1106 may be configured to determining a loudness metric offset based on a comparison between the loudness metric and a target loudness metric. The rendering/transmission module 1108 may be configured to determine the amplitude of the at least one of the received object-based audio signals based on the comparison between the loudness metric and the target loudness metric. In one configuration, the loudness metric determination module 1106 may be configured to determine whether the loudness metric is greater than the target loudness metric. The rendering/transmission module 1108 may be configured to adjust the amplitude of the at least one of the received object-based audio signals when the loudness metric is determined to be greater than the target loudness metric.

In one configuration, the rendering/transmission module 1108 may adjust an amplitude of at least one of the received object-based audio signals based on the determined loudness metric before transmitting the received object-based audio signals. In one configuration, the object-based audio signals are associated with a program bitstream, and the rendering/transmission module 1108 is configured to modify an amplitude of at least one of the received object-based audio signals in program specific metadata of the program bitstream based on the determined loudness metric before transmitting the received object-based audio signals.

In one configuration, the loudness metric determination module 1106 may be configured to determine the loudness metric further based on, for each object-based audio signal of the received object-based audio signals, positional data of the object-based audio signal with respect to a reception point. The positional data may include at least one of an azimuth between a location of the object-based audio signal and the reception point, or an elevation between the location of the object-based audio signal and the reception point. The positional data may further include a distance between the location of the object-based audio signal and the reception point. The loudness metric determination module 1106 may determine the loudness metric further based on, for each object-based audio signal of the received object-based audio signals, at least one of a correlation factor of the object-based audio signal with respect to one or more other object-based audio signals of the received object-based audio signals, an amplitude scaling factor of the object-based audio signal, or a frequency dependent weight factor of the object-based audio signal to account for hearing loudness sensitivity as a function of an angular location of the object-based audio signal with respect to a reception point.

In one configuration, the loudness metric determination module 1106 may determine the loudness metric based on $\Sigma_i^N$ FJJT($r_i$, $r_L$, $\theta_i$, $\varphi_i$, $a_i$, $g_i$, $c_i$)$z_i$, where $i \in I$, I is the set of object-based audio signals, N is a number of object-based audio signals in the received object-based audio signals, $z_i$ is said at least one of the loudness parameter or the power parameter for an $i^{th}$ object-based audio signal, $r_i$ is a location associated with the $i^{th}$ object-based audio signal, $r_L$ is a location associated with a reception point, $\theta_i$ is an azimuth between the location of the $i^{th}$ object-based audio signal and the reception point, $\varphi_i$ is an elevation between the location of the $i^{th}$ object-based audio signal and the reception point, $a_i$ is an amplitude scaling factor of the $i^{th}$ object-based audio signal, $g_i$ is a frequency dependent weight factor of the $i^{th}$ object-based audio signal to account for hearing loudness sensitivity as a function of an angular location of the $i^{th}$ object-based audio signal with respect to the reception point, and $c_i$ is a correlation factor of the $i^{th}$ object-based audio signal with respect to one or more other object-based audio signals of the received object-based audio signals.

In one configuration, the reception module 1104 may receive user-specific input indicating the received object-based audio signals. In one configuration, the reception module 1104 may receive information indicating a new set of object-based audio signals. The information indicating the set of object-based audio signals may be received based on user input. In such a configuration, the loudness metric determination module 1106 may re-determining the loudness metric based on the set of object-based audio signals and based on the at least one of the loudness parameter or the power parameter for each object-based audio signal of the set of object-based audio signals.

In one configuration, the object metadata of each object-based audio signal includes at least one of positional data of the object-based audio signal with respect to a reception point, or an amplitude scaling factor of the object-based audio signal. In one configuration, the positional data of the object-based audio signal with respect to the reception point includes at least one of a distance between a location of the object-based audio signal and the reception point, an azimuth between the location of the object-based audio signal and the reception point, or an elevation between the location of the object-based audio signal and the reception point.

In one configuration, the loudness metric is an average loudness over T ms, and the loudness metric is determined every T ms. In one configuration, the loudness metric is an average loudness over T ms, and the loudness metric is determined every D ms where $D<T$. In one configuration, the loudness metric is determined over a plurality of window periods, each of which overlap with a previous window. In one configuration, each of the window periods have a duration of 400 ms and overlap other window periods by 300 ms. In one configuration, the received object-based audio signals include N object-based audio signals, the received object-based audio signals are rendered through speakers having n channels, and N is uncorrelated with n.

The apparatus may include additional modules that perform each of the blocks of the algorithm in the aforementioned flow charts of FIGS. 9, 10. As such, each block in the aforementioned flow charts of FIGS. 9, 10 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

In one configuration, the apparatus for processing object-based audio signals for reproduction through a playback system includes means for receiving a plurality of object-based audio signals. Each object-based audio signal of the object-based audio signals includes audio waveform data and object metadata associated with the audio waveform data. The object metadata includes at least one of a loudness parameter or a power parameter associated with the audio waveform data. The apparatus further includes means for determining a loudness metric based on the received object-based audio signals and based on the at least one of the loudness parameter or the power parameter for each object-based audio signal of the received object-based audio signals. The apparatus further includes means for rendering the received object-based audio signals to a set of output signals based on the determined loudness metric.

In one configuration, the means for rendering the received object-based audio signals is configured to adjust an amplitude of at least one of the received object-based audio signals based on the determined loudness metric. In one configuration, the apparatus includes means for determining a loudness metric offset based on a comparison between the loudness metric and a target loudness metric. In such a configuration, the amplitude of the at least one of the received object-based audio signals is adjusted based on the comparison between the loudness metric and the target loudness metric. In one configuration, the apparatus includes means for determining whether the loudness metric is greater than the target loudness metric. In such a configuration, the amplitude of the at least one of the received object-based audio signals is adjusted when the loudness metric is determined to be greater than the target loudness metric.

In one configuration, an apparatus for processing object-based audio signals for at least one of broadcast, file delivery, or streaming includes means for receiving a plurality of object-based audio signals. Each object-based audio signal of the object-based audio signals includes audio waveform data and object metadata associated with the audio waveform data. The object metadata includes at least one of a loudness parameter or a power parameter associated with the audio waveform data. The apparatus further includes means for determining a loudness metric based on the received object-based audio signals and based on the at least one of the loudness parameter or the power parameter for each object-based audio signal of the received object-based audio signals. The apparatus further includes means for transmitting the received object-based audio signals based on the determined loudness metric.

The various illustrative logical blocks, modules, methods, and algorithm processes and sequences described in connection with the embodiments disclosed herein can be implemented as electronic hardware, computer software, or combinations of both. To clearly illustrate this interchangeability of hardware and software, various illustrative components, blocks, modules, and process actions have been described supra generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of this document.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, such as a combination of a DSP and a microprocessor, a plurality of microprocessors, one or more microprocessors in conjunction with a DSP core, or any other such configuration.

Embodiments of the spatial normalization OBA loudness management system and method described herein are operational within numerous types of general purpose or special purpose computing system environments or configurations. In general, a computing environment can include any type of computer system, including, but not limited to, a computer system based on one or more microprocessors, a mainframe computer, a digital signal processor, a portable computing device, a personal organizer, a device controller, a computational engine within an appliance, a mobile phone, a desktop computer, a mobile computer, a tablet computer, a smartphone, and appliances with an embedded computer, to name a few.

Such computing devices can be typically be found in devices having at least some minimum computational capability, including, but not limited to, personal computers, server computers, hand-held computing devices, laptop or mobile computers, communications devices such as cell phones and PDA's, multiprocessor systems, microprocessor-based systems, set top boxes, programmable consumer electronics, network PCs, minicomputers, mainframe computers, audio or video media players, and so forth. In some embodiments the computing devices will include one or more processors. Each processor may be a specialized microprocessor, such as a DSP, a very long instruction word (VLIW), or other micro-controller, or can be conventional CPUs having one or more processing cores, including specialized graphics processing unit (GPU)-based cores in a multi-core CPU.

The process actions of a method, process, or algorithm described in connection with the embodiments disclosed herein can be embodied directly in hardware, in a software module executed by a processor, or in any combination of the two. The software module can be contained in computer-readable media that can be accessed by a computing device. The computer-readable media includes both volatile and nonvolatile media that is either removable, non-removable, or some combination thereof. The computer-readable media is used to store information such as computer-readable or computer-executable instructions, data structures, program modules, or other data. By way of example, and not limitation, computer readable media may comprise computer storage media and communication media.

Computer storage media includes, but is not limited to, computer or machine readable media or storage devices such as optical storage devices, Blu-ray discs (BD), digital versatile discs (DVDs), compact discs (CDs), floppy disks, tape drives, hard drives, optical drives, solid state memory devices, random-access memory (RAM) memory, ROM memory, EPROM memory, EEPROM memory, flash memory or other memory technology, magnetic cassettes, magnetic tapes, magnetic disk storage, or other magnetic storage devices, or any other device which can be used to store the desired information and which can be accessed by one or more computing devices.

A software module can reside in the RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an ASIC. The ASIC can reside in a user terminal. Alternatively, the processor and the storage medium can reside as discrete components in a user terminal.

The phrase "non-transitory" as used in this document means "enduring or long-lived." The phrase "non-transitory computer-readable media" includes any and all computer-readable media, with the sole exception of a transitory, propagating signal. This includes, by way of example and not limitation, non-transitory computer-readable media such as register memory, processor cache, and RAM.

Retention of information such as computer-readable or computer-executable instructions, data structures, program modules, and so forth, can also be accomplished by using a variety of the communication media to encode one or more modulated data signals, electromagnetic waves (such as carrier waves), or other transport mechanisms or communications protocols, and includes any wired or wireless information delivery mechanism. In general, these communication media refer to a signal that has one or more of its characteristics set or changed in such a manner as to encode information or instructions in the signal. For example, communication media includes wired media such as a wired network or direct-wired connection carrying one or more modulated data signals, and wireless media such as acoustic, radio frequency (RF), infrared, laser, and other wireless media for transmitting, receiving, or both, one or more modulated data signals or electromagnetic waves. Combinations of the any of the above should also be included within the scope of communication media.

Further, one or any combination of software, programs, computer program products that embody some or all of the various embodiments of the spatial normalization OBA loudness management system and method described herein, or portions thereof, may be stored, received, transmitted, or read from any desired combination of computer or machine readable media or storage devices and communication media in the form of computer executable instructions or other data structures.

Embodiments of the spatial normalization OBA loudness management system and method described herein may be further described in the general context of computer-executable instructions, such as program modules, being executed by a computing device. Generally, program modules include routines, programs, objects, components, data structures, and so forth, which perform particular tasks or implement particular abstract data types. The embodiments described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may or may not include a processor.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms “comprising,” “including,” “having,” and the like are synonymous and are used inclusively, in an open-ended fashion, and do not exclude additional elements, features, acts, operations, and so forth. Also, the term “or” is used in its inclusive sense (and not in its exclusive sense) so that when used, for example, to connect a list of elements, the term “or” means one, some, or all of the elements in the list.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the spatial normalization OBA loudness management system and method described herein can be embodied within a form that does not provide all of the features and benefits set forth herein, as some features can be used or practiced separately from others.

Moreover, although the subject matter has been described in language specific to structural features and methodological acts, it is to be understood that the subject matter defined in the appended claims is not necessarily limited to the specific features or acts described supra. Rather, the specific features and acts described supra are disclosed as example forms of implementing the claims.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean “one and only one” unless specifically so stated, but rather “one or more.” The word “exemplary” is used herein to mean “serving as an example, instance, or illustration.” Any aspect described herein as “exemplary” is not necessarily to be construed as preferred or advantageous over other aspects.” Unless specifically stated otherwise, the term “some” refers to one or more. Combinations such as “at least one of A, B, or C,” “at least one of A, B, and C,” and “A, B, C, or any combination thereof” include any combination of A, B, and/or C, and may include multiples of A, multiples of B, or multiples of C. Specifically, combinations such as “at least one of A, B, or C,” “at least one of A, B, and C,” and “A, B, C, or any combination thereof” may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase “means for.”

What is claimed is:

1. A method of processing object-based audio signals for reproduction through a playback system, comprising:

receiving a plurality of object-based audio signals, each object-based audio signal of the received object-based audio signals including audio waveform data and object metadata associated with the audio waveform data, the object metadata including at least one of a loudness parameter or a power parameter associated with the audio waveform data;

determining a loudness metric based on the received object-based audio signals and based on said at least one of the loudness parameter or the power parameter and positional data of an object-based audio signal with respect to a reception point for each object-based audio signal of the received object-based audio signals; and rendering the received object-based audio signals to a set of output signals based on the determined loudness metric;

wherein the loudness metric is determined based on $\Sigma_i^N \text{FJJT}(r_i, r_L, \theta_i, \varphi_i, a_i, g_i, c_i)z_i$, where $i \in I$, I is a set of object-based audio signals, N is a number of object-based audio signals in the received object-based audio signals, $z_i$ is said at least one of the loudness parameter or the power parameter for an $i^{th}$ object-based audio signal, $r_i$ is a location associated with the $i^{th}$ object-based audio signal, $r_L$ is a location associated with a reception point, $\theta_i$ is an azimuth between the location of the $i^{th}$ object-based audio signal and the reception point, $\varphi_i$ is an elevation between the location of the $i^{th}$ object-based audio signal and the reception point, $a_i$ is an amplitude scaling factor of the $i^{th}$ object-based audio signal, $g_i$ is a frequency dependent weight factor of the $i^{th}$ object-based audio signal to account for hearing loudness sensitivity as a function of an angular location of the $i^{th}$ object-based audio signal with respect to the reception point, and $c_i$ is a correlation factor of the $i^{th}$ object-based audio signal with respect to one or more other object-based audio signals of the received object-based audio signals.

2. The method of claim 1, wherein the rendering of the received object-based audio signals comprises adjusting an amplitude of at least one of the received object-based audio signals based on the determined loudness metric.

3. The method of claim 2, further comprising determining a loudness metric offset based on a comparison between the loudness metric and a target loudness metric, wherein the amplitude of the at least one of the received object-based audio signals is adjusted based on the comparison between the loudness metric and the target loudness metric.

4. The method of claim 3, further comprising determining whether the loudness metric is greater than the target loudness metric, wherein the amplitude of the at least one of the received object-based audio signals is adjusted when the loudness metric is determined to be greater than the target loudness metric.

5. The method of claim 1, wherein the positional data comprises at least one of an azimuth between a location of the object-based audio signal and the reception point, or an elevation between the location of the object-based audio signal and the reception point.

6. The method of claim 5, wherein the positional data further comprises a distance between the location of the object-based audio signal and the reception point.

7. The method of claim 1, wherein the loudness metric is determined further based on, for each object-based audio signal of the received object-based audio signals, at least one of a correlation factor of an object-based audio signal with respect to one or more other object-based audio signals of the received object-based audio signals, an amplitude scaling factor of the object-based audio signal, or a frequency dependent weight factor of the object-based audio signal to account for hearing loudness sensitivity as a function of an angular location of the object-based audio signal with respect to a reception point.

8. The method of claim 1, wherein the received object-based audio signals are user-specified.

9. The method of claim 8, further comprising receiving information indicating a new set of object-based audio signals, the information indicating the set of object-based audio signals being received based on user input, the method further comprising redetermining the loudness metric based on the set of object-based audio signals and based on said at least one of the loudness parameter or the power parameter for each object-based audio signal of the set of object-based audio signals.

10. The method of claim 1, wherein the object metadata of each object-based audio signal includes at least one of positional data of the object-based audio signal with respect to a reception point, or an amplitude scaling factor of the object-based audio signal.

11. The method of claim 10, wherein the positional data of the object-based audio signal with respect to the reception point comprises at least one of a distance between a location of the object-based audio signal and the reception point, an azimuth between the location of the object-based audio signal and the reception point, or an elevation between the location of the object-based audio signal and the reception point.

12. The method of claim 1, wherein the loudness metric is an average loudness over T ms, and the loudness metric is determined every T ms.

13. The method of claim 1, wherein the loudness metric is an average loudness over T ms, and the loudness metric is determined every D ms where $D<T$.

14. The method of claim 13, wherein the loudness metric is determined over a plurality of window periods, each of which overlap with a previous window.

15. The method of claim 14, wherein each of the window periods have a duration of 400 ms and overlap other window periods by 300 ms.

16. The method of claim 1, wherein the received object-based audio signals comprise N object-based audio signals, the received object-based audio signals are rendered through speakers comprising n channels, and N is uncorrelated with n.

17. A method of processing object-based audio signals for at least one of broadcast, file delivery, or streaming, comprising:

receiving a plurality of object-based audio signals, each object-based audio signal of the object-based audio signals including audio waveform data and object metadata associated with the audio waveform data, the object metadata including at least one of a loudness parameter or a power parameter associated with the audio waveform data;

determining a loudness metric based on the received object-based audio signals and based on said at least one of the loudness parameter or the power parameter and positional data of an object-based audio signal with respect to a reception point for each object-based audio signal of the received object-based audio signals; and transmitting the received object-based audio signals based on the determined loudness metric;

wherein the loudness metric is determined based on $\Sigma_i^N \mathrm{FJJT}(r_i, r_L, \theta_i, \varphi_i, a_i, g_i, c_i) z_i$, where $i \in I$, I is a set of object-based audio signals, N is a number of object-based audio signals in the received object-based audio signals, $z_i$ is said at least one of the loudness parameter or the power parameter for an $i^{th}$ object-based audio signal, $r_i$ is a location associated with the $i^{th}$ object-based audio signal, $r_L$ is a location associated with a reception point, $\theta_i$ is an azimuth between the location of the $i^{th}$ object-based audio signal and the reception point, $\varphi_i$ is an elevation between the location of the $i^{th}$ object-based audio signal and the reception point, $a_i$ is an amplitude scaling factor of the $i^{th}$ object-based audio signal, $g_i$ is a frequency dependent weight factor of the $i^{th}$ object-based audio signal to account for hearing loudness sensitivity as a function of an angular location of the $i^{th}$ object-based audio signal with respect to the reception point, and $c_i$ is a correlation factor of the $i^{th}$ object-based audio signal with respect to one or more other object-based audio signals of the received object-based audio signals.

18. The method of claim 17, further comprising adjusting an amplitude of at least one of the received object-based audio signals based on the determined loudness metric before transmitting the received object-based audio signals.

19. The method of claim 17, wherein the object-based audio signals are associated with a program bitstream, and the method further comprises modifying an amplitude of at least one of the received object-based audio signals in program specific metadata of the program bitstream based on the determined loudness metric before transmitting the received object-based audio signals.

20. An apparatus for processing object-based audio signals for reproduction through a playback system, comprising:

means for receiving a plurality of object-based audio signals, each object-based audio signal of the received object-based audio signals including audio waveform data and object metadata associated with the audio waveform data, the object metadata including at least one of a loudness parameter or a power parameter associated with the audio waveform data;

means for determining a loudness metric based on the received object-based audio signals and based on said at least one of the loudness parameter or the power parameter and positional data of an object-based audio signal with respect to a reception point for each object-based audio signal of the received object-based audio signals; and means for rendering the received object-based audio signals to a set of output signals based on the determined loudness metric;

wherein the loudness metric is determined based on $\Sigma_i^N \mathrm{FJJT}(r_i, r_L, \theta_i, \varphi_i, a_i, g_i, c_i) z_i$, where $i \in I$, I is a set of object-based audio signals, N is a number of object-based audio signals in the received object-based audio signals, $z_i$ is said at least one of the loudness parameter or the power parameter for an $i^{th}$ object-based audio signal, $r_i$ is a location associated with the $i^{th}$ object-based audio signal, $r_L$ is a location associated with a reception point, $\theta_i$ is an azimuth between the location of the $i^{th}$ object-based audio signal and the reception point, $\varphi_i$ is an elevation between the location of the $i^{th}$ object-based audio signal and the reception point, $a_i$ is an amplitude scaling factor of the $i^{th}$ object-based audio signal, $g_i$ is a frequency dependent weight factor of the $i^{th}$ object-based audio signal to account for hearing loudness sensitivity as a function of an angular location of the $i^{th}$ object-based audio signal with respect to the reception point, and $c_i$ is a correlation factor of the $i^{th}$ object-based audio signal with respect to one or more other object-based audio signals of the received object-based audio signals.

21. The apparatus of claim 20, wherein the means for rendering the received object-based audio signals is configured to adjust an amplitude of at least one of the received object-based audio signals based on the determined loudness metric.

22. The apparatus of claim 21, further comprising means for determining a loudness metric offset based on a comparison between the loudness metric and a target loudness metric, wherein the amplitude of the at least one of the received object-based audio signals is adjusted based on the comparison between the loudness metric and the target loudness metric.

23. The apparatus of claim 22, further comprising means for determining whether the loudness metric is greater than the target loudness metric, wherein the amplitude of the at least one of the received object-based audio signals is adjusted when the loudness metric is determined to be greater than the target loudness metric.

24. The apparatus of claim 20, wherein the loudness metric is determined further based on, for each object-based audio signal of the received object-based audio signals, at least one of a correlation factor of the object-based audio signal with respect to one or more other object-based audio signals of the received object-based audio signals, an amplitude scaling factor of the object-based audio signal, or a frequency dependent weight factor of the object-based audio signal to account for hearing loudness sensitivity as a function of an angular location of the object-based audio signal with respect to a reception point.

25. An apparatus for processing object-based audio signals for at least one of broadcast, file delivery, or streaming, comprising:

means for receiving a plurality of object-based audio signals, each object-based audio signal of the received object-based audio signals including audio waveform data and object metadata associated with the audio waveform data, the object metadata including at least one of a loudness parameter or a power parameter associated with the audio waveform data;

means for determining a loudness metric based on the received object-based audio signals and based on said at least one of the loudness parameter or the power parameter and positional data of an object-based audio signal with respect to a reception point for each object-based audio signal of the received object-based audio signals; and means for transmitting the received object-based audio signals based on the determined loudness metric;

wherein the loudness metric is determined based on $\Sigma_i^N$FJJT $(r_i, r_L, \theta_i, \varphi_i, a_i, g_i, c_i)z_i$, where $i \in I$, I is a set of object-based audio signals, N is a number of object-based audio signals in the received object-based audio signals, $z_i$ is said at least one of the loudness parameter or the power parameter for an $i^{th}$ object-based audio signal, $r_i$ is a location associated with the $i^{th}$ object-based audio signal, $r_L$ is a location associated with a reception point, $\theta_i$ is an azimuth between the location of the $i^{th}$ object-based audio signal and the reception point, $\varphi_i$ is an elevation between the location of the $i^{th}$ object-based audio signal and the reception point, $a_i$ is an amplitude scaling factor of the $i^{th}$ object-based audio signal, $g_i$ is a frequency dependent weight factor of the $i^{th}$ object-based audio signal to account for hearing loudness sensitivity as a function of an angular location of the $i^{th}$ object-based audio signal with respect to the reception point, and $c_i$ is a correlation factor of the $i^{th}$ object-based audio signal with respect to one or more other object-based audio signals of the received object-based audio signals.

26. An apparatus for processing object-based audio signals for reproduction through a playback system, comprising:

a memory; and at least one processor coupled to the memory and configured to:

receive a plurality of object-based audio signals, each object-based audio signal of the received object-based audio signals including audio waveform data and object metadata associated with the audio waveform data, the object metadata including at least one of a loudness parameter or a power parameter and associated with the audio waveform data;

determine a loudness metric based on the received object-based audio signals and based on said at least one of the loudness parameter or the power parameter and positional data of an object-based audio signal with respect to a reception point for each object-based audio signal of the received object-based audio signals; and render the received object-based audio signals to a set of output signals based on the determined loudness metric;

wherein the loudness metric is determined based on $\Sigma_i^N$FJJT $(r_i, r_L, \theta_i, \varphi_i, a_i, g_i, c_i)z_i$, where $i \in I$, I is a set of object-based audio signals, N is a number of object-based audio signals in the received object-based audio signals, $z_i$ is said at least one of the loudness parameter or the power parameter for an $i^{th}$ object-based audio signal, $r_i$ is a location associated with the $i^{th}$ object-based audio signal, $r_L$ is a location associated with a reception point, $\theta_i$ is an azimuth between the location of the $i^{th}$ object-based audio signal and the reception point, $\varphi_i$ is an elevation between the location of the $i^{th}$ object-based audio signal and the reception point, $a_i$ is an amplitude scaling factor of the $i^{th}$ object-based audio signal, $g_i$ is a frequency dependent weight factor of the $i^{th}$ object-based audio signal to account for hearing loudness sensitivity as a function of an angular location of the $i^{th}$ object-based audio signal with respect to the reception point, and $c_i$ is a correlation factor of the $i^{th}$ object-based audio signal with respect to one or more other object-based audio signals of the received object-based audio signals.

27. The apparatus of claim 26, wherein the at least one processor is configured to render the received object-based audio by adjusting an amplitude of at least one of the received object-based audio signals based on the determined loudness metric.

28. The apparatus of claim 27, wherein the at least one processor is further configured to determine a loudness metric offset based on a comparison between the loudness metric and a target loudness metric, wherein the amplitude of the at least one of the received object-based audio signals is adjusted based on the comparison between the loudness metric and the target loudness metric.

29. The apparatus of claim 28, wherein the at least one processor is further configured to determine whether the loudness metric is greater than the target loudness metric, wherein the amplitude of the at least one of the received object-based audio signals is adjusted when the loudness metric is determined to be greater than the target loudness metric.

30. The apparatus of claim 26, wherein the loudness metric is determined further based on, for each object-based audio signal of the received object-based audio signals, at least one of a correlation factor of the object-based audio signal with respect to one or more other object-based audio signals of the received object-based audio signals, an amplitude scaling factor of the object-based audio signal, or a frequency dependent weight factor of the object-based audio signal to account for hearing loudness sensitivity as a function of an angular location of the object-based audio signal with respect to a reception point.

31. An apparatus for processing object-based audio signals for at least one of broadcast, file delivery, or streaming, comprising:

a memory; and at least one processor coupled to the memory and configured to:

receive a plurality of object-based audio signals, each object-based audio signal of the received object-based audio signals including audio waveform data and object metadata associated with the audio waveform data, the object metadata including at least one of a loudness parameter or a power parameter associated with the audio waveform data;

determine a loudness metric based on the received object-based audio signals and based on said at least one of the loudness parameter or the power parameter and positional data of an object-based audio signal with respect to a reception point for each object-based audio signal of the received object-based audio signals; and transmit the received object-based audio signals based on the determined loudness metric;

wherein the loudness metric is determined based on $\Sigma_i^N$FJJT $(r_i, r_L, \theta_i, \varphi_i, a_i, g_i, c_i)z_i$, where $i \in I$, I is a set of object-based audio signals, N is a number of object-based audio signals in the received object-based audio signals, $z_i$ is said at least one of the loudness parameter or the power parameter for an $i^{th}$ object-based audio signal, $r_i$ is a location associated with the $i^{th}$ object-based audio signal, $r_L$ is a location associated with a reception point, $\theta_i$ is an azimuth between the location of the $i^{th}$ object-based audio signal and the reception point, $\varphi_i$ is an elevation between the location of the $i^{th}$ object-based audio signal and the reception point, $a_i$ is an amplitude scaling factor of the $i^{th}$ object-based audio signal, $g_i$ is a frequency dependent weight factor of the $i^{th}$ object-based audio signal to account for hearing loudness sensitivity as a function of an angular location of the $i^{th}$ object-based audio signal with respect to the reception point, and $c_i$ is a correlation factor of the $i^{th}$ object-based audio signal with respect to one or more other object-based audio signals of the received object-based audio signals.

* * * * *